US008604615B2

(12) United States Patent
Lee et al.

(10) Patent No.: US 8,604,615 B2
(45) Date of Patent: Dec. 10, 2013

(54) SEMICONDUCTOR DEVICE INCLUDING A STACK OF SEMICONDUCTOR CHIPS, UNDERFILL MATERIAL AND MOLDING MATERIAL

(75) Inventors: Chung-Sun Lee, Anyang-si (KR); Jung-Hwan Kim, Bucheon-si (KR); Tae-Hong Min, Gumi-si (KR); Hyun-Jung Song, Asan-si (KR); Sun-Pil Youn, Seoul-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/174,813

(22) Filed: Jul. 1, 2011

(65) Prior Publication Data
US 2012/0193779 A1    Aug. 2, 2012

(30) Foreign Application Priority Data

Jan. 28, 2011    (KR) .......................... 10-2011-0008990

(51) Int. Cl.
*H01L 23/48* (2006.01)
*H01L 21/82* (2006.01)
*H01L 21/56* (2006.01)

(52) U.S. Cl.
USPC .............. 257/737; 257/E23.01; 257/E21.502; 257/E21.602; 257/686; 257/685; 257/723; 257/724; 257/728; 257/734; 257/738; 257/778; 257/777; 257/784; 257/789; 257/790; 257/793; 257/788

(58) Field of Classification Search
USPC .............. 257/737, E23.01, E21.502, E21.602, 257/686, 685, 723, 724, 728, 734, 738, 778, 257/777, 784–793
See application file for complete search history.

(56) References Cited

U.S. PATENT DOCUMENTS

| 6,762,511 B2 * | 7/2004 | Satsu et al. ..................... 257/789 |
| 6,888,174 B2 * | 5/2005 | Hohn et al. ..................... 257/100 |
| 6,919,220 B2 | 7/2005 | Akram |

(Continued)

FOREIGN PATENT DOCUMENTS

| JP | 2007-207872 | 8/2007 |
| JP | 2008-270303 | 11/2008 |

(Continued)

*Primary Examiner* — A O Williams
(74) *Attorney, Agent, or Firm* — Muir Patent Consulting, PLLC

(57) ABSTRACT

A stack of semiconductor chips, a semiconductor device, and a method of manufacturing are disclosed. The stack of semiconductor chips may comprise a first chip of the stack, a second chip of the stack over the first chip, conductive bumps, a homogeneous integral underfill material, and a molding material. The conductive bumps may extend between an upper surface of the first chip and a lower surface of the second chip. The homogeneous integral underfill material may be interposed between the first chip and the second chip, encapsulate the conductive bumps, and extend along sidewalls of the second chip. The homogeneous integral underfill material may have an upper surface extending in a direction parallel to an upper surface of the second chip and located adjacent the upper surface of the second chip. The molding material may be on outer side surfaces of the homogeneous integral underfill material above the upper surface of the first chip, wherein, in view of a first cross sectional profile, the molding material is separated from sidewalls of the second chip by the homogeneous integral underfill material such that the molding material does not contact sidewalls of the second chip.

42 Claims, 27 Drawing Sheets

(56) References Cited

U.S. PATENT DOCUMENTS

| | | |
|---|---|---|
| 7,262,077 B2 | 8/2007 | Lai et al. |
| 2001/0026020 A1* | 10/2001 | Fenk et al. .................... 257/767 |
| 2002/0167077 A1* | 11/2002 | Vincent .......................... 257/684 |
| 2004/0051111 A1* | 3/2004 | Ota et al. ......................... 257/98 |
| 2005/0028361 A1* | 2/2005 | Yin et al. ......................... 29/841 |
| 2007/0080434 A1* | 4/2007 | Ho et al. ........................ 257/666 |
| 2009/0200662 A1 | 8/2009 | Ng et al. |
| 2009/0261460 A1 | 10/2009 | Kuan et al. |
| 2011/0031527 A1* | 2/2011 | Kotani et al. .................. 257/100 |
| 2011/0039978 A1* | 2/2011 | Kotani et al. .................. 523/218 |
| 2011/0098420 A1* | 4/2011 | Takizawa et al. .............. 525/477 |
| 2012/0211885 A1* | 8/2012 | Choi et al. ..................... 257/737 |

FOREIGN PATENT DOCUMENTS

| | | |
|---|---|---|
| JP | 2009-170802 | 7/2009 |
| KR | 10-2002-0020088 A | 3/2002 |
| KR | 10-2003-0029680 A | 4/2003 |
| KR | 10-0708968 B1 | 3/2007 |
| KR | 20-2007-0076084 A | 7/2007 |

* cited by examiner

1000

SEMICONDUCTOR DEVICE INCLUDING A STACK OF SEMICONDUCTOR CHIPS, UNDERFILL MATERIAL AND MOLDING MATERIAL

This application claims priority from Korean Patent Application No. 10-2011-0008990 filed on Jan. 28, 2011 in the Korean Intellectual Property Office, the disclosure of which is incorporated herein by reference in its entirety.

BACKGROUND

1. Field of the Invention

The disclosed embodiments relate to a semiconductor device and a method of fabricating the same.

2. Description of the Related Art

The current trend in the electronic industry is to manufacture lighter, smaller, faster, multifunctional, and high-performance products at lower costs. To accomplish these objectives, multi-chip stacked package technology or system in package technology is used. Often, the multi-chip stacked package technology or the system in package technology uses through vias.

A multi-chip stacked package or a system in package combines functions of a plurality of unit semiconductor elements in a single semiconductor package. Multi-chip stacked packages or system in packages may be thicker than conventional single chip packages. In a two-dimensional plane, however, they are almost similar in size to conventional single chip packages. Therefore, multi-chip stacked packages or system in packages are mainly used in high-performance products that require small size or portability, such as mobile phones, notebook computers, memory cards, and portable camcorders.

SUMMARY

Aspects of the disclosed embodiments provide a semiconductor device that can effectively dissipate heat and prevent the reliability thereof from being reduced by thermal expansion.

Aspects of the disclosed embodiments also provide a method of fabricating the semiconductor device.

However, aspects of the disclosed embodiments are not restricted to the ones set forth herein. The above and other aspects of the present disclosure will become more apparent to one of ordinary skill in the art to which the disclosed embodiments pertain by referencing the detailed description given below.

BRIEF DESCRIPTION OF THE DRAWINGS

The above and other aspects and features disclosed herein will become more apparent by describing in detail exemplary embodiments thereof with reference to the attached drawings, in which.

DETAILED DESCRIPTION OF THE EMBODIMENTS

Figure 1:
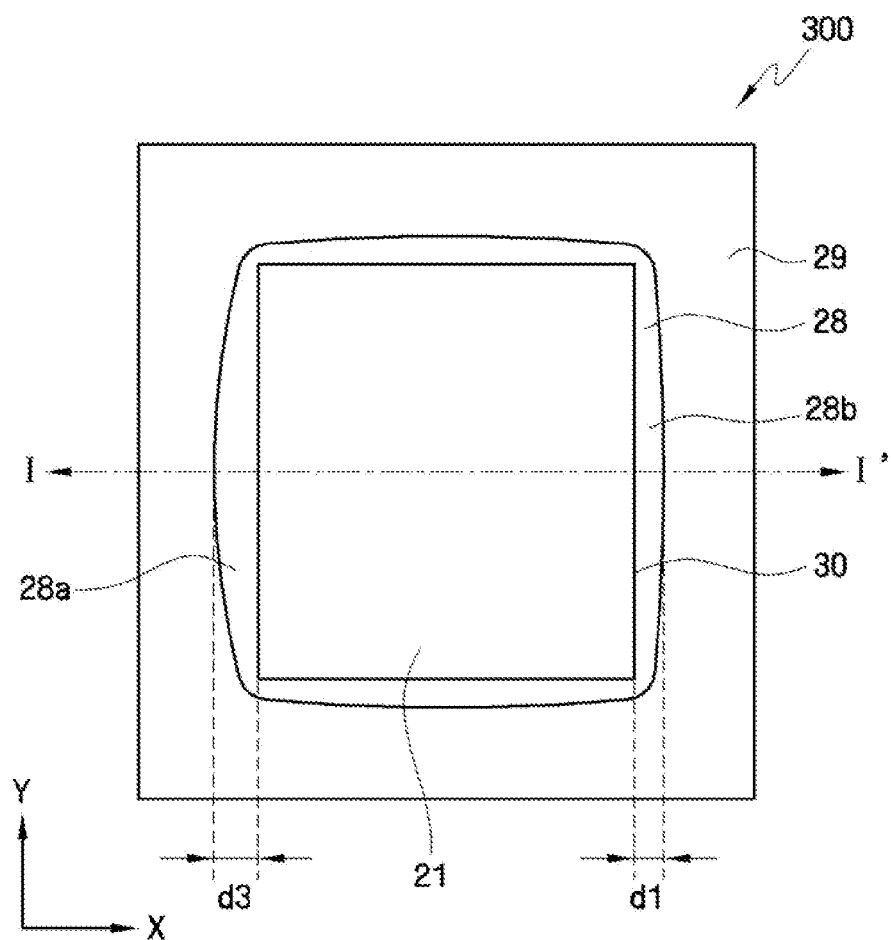
FIG. 1 is a plan view of a semiconductor device according to an exemplary embodiment.

Advantages and features of the disclosed embodiments and methods of accomplishing the same may be understood more readily by reference to the following detailed description of exemplary embodiments and the accompanying drawings. The present invention may, however, be embodied in many different forms and should not be construed as being limited to the embodiments set forth herein. In the drawings, sizes and relative sizes of elements may be exaggerated for clarity.

Like reference numerals refer to like elements throughout the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises," "includes," and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, these elements should not be limited by these terms. Unless indicated otherwise, these terms are only used to distinguish one element from another element. Thus, a first element discussed below could be termed a second element without departing from the teachings of the disclosed embodiments.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Embodiments are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
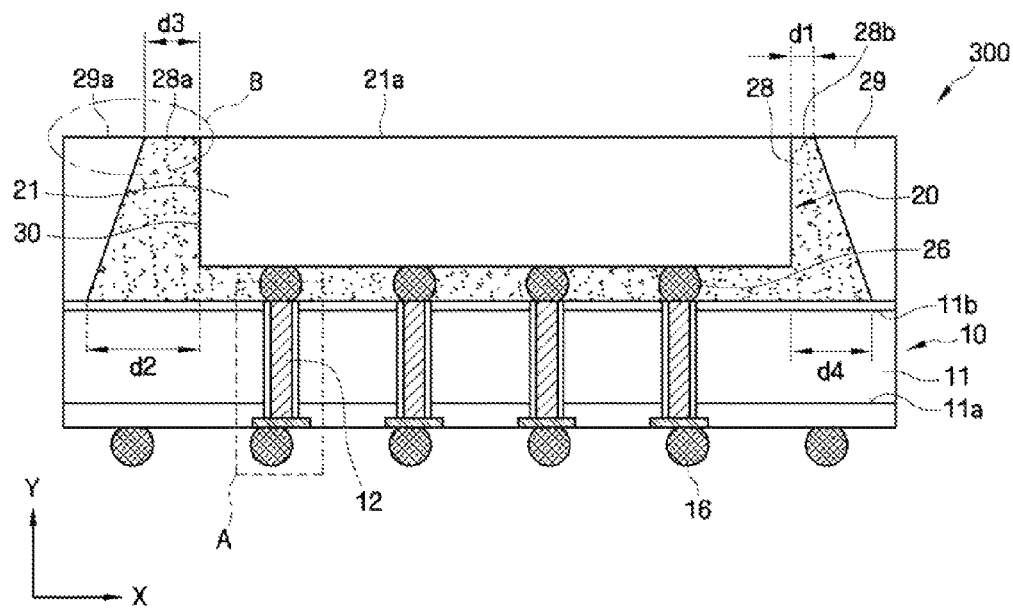
FIG. 2 is a cross-sectional view taken along the line I-I' of FIG. 1, according to an exemplary embodiment.
Figure 3:
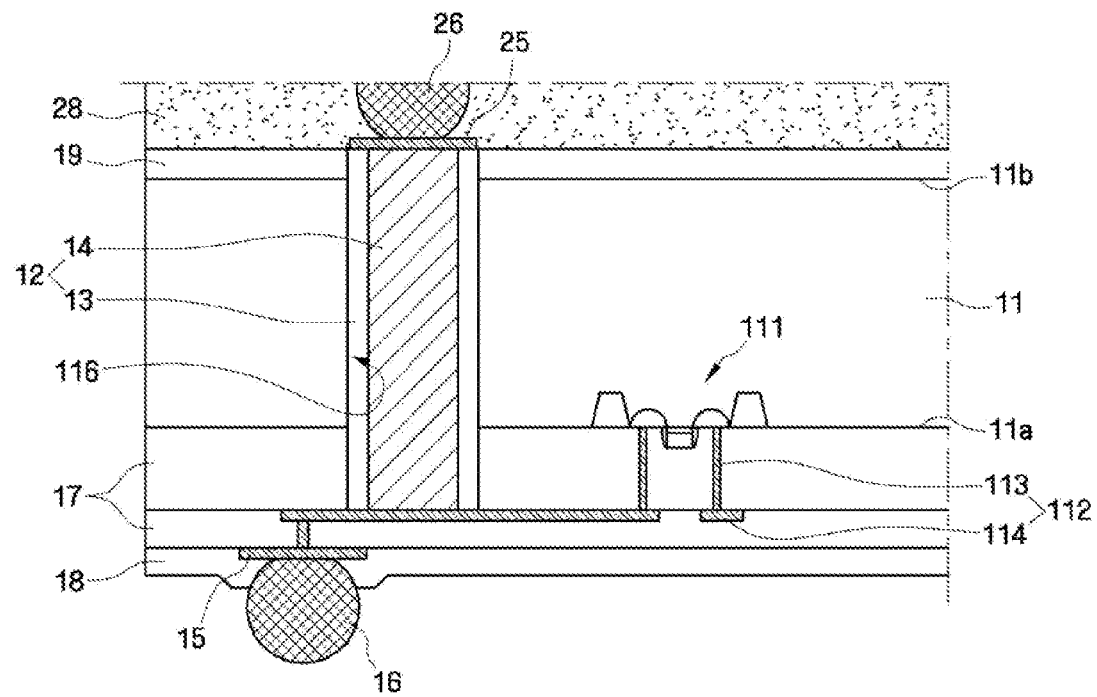
FIG. 3 is an enlarged view of a portion A shown in FIG. 2, according to an exemplary embodiment.
Figure 4:
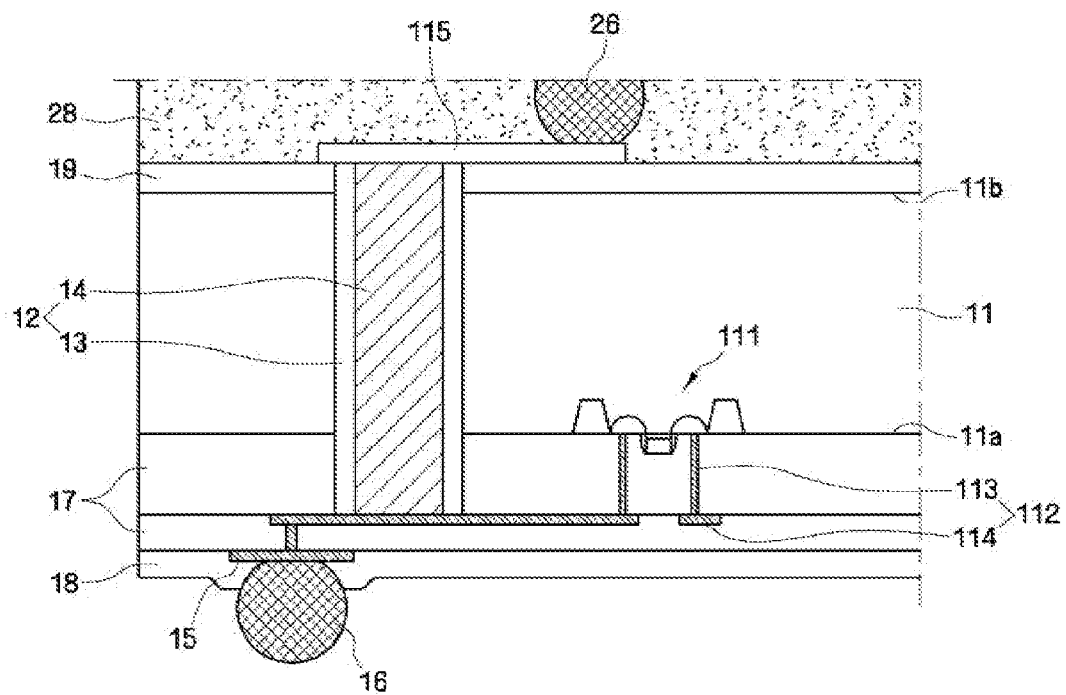
FIG. 4 is a diagram illustrating a modified embodiment of FIG. 3, according to an exemplary embodiment.

Hereinafter, a semiconductor device according to exemplary embodiments will be described with reference to FIGS. 1 through 7. FIG. 1 is a plan view of a semiconductor device 300 according to an exemplary embodiment. FIG. 2 is a cross-sectional view taken along the line I-I' of FIG. 1, according to an exemplary embodiment. FIG. 3 is an enlarged view of a portion A shown in FIG. 2, according to an exemplary embodiment. FIG. 4 is a diagram illustrating a modified embodiment of FIG. 3. FIGS. 5A, 5B, 6A and 6B are enlarged views illustrating modified embodiments of a portion B shown in FIG. 2. FIG. 7 is a diagram illustrating a case where a semiconductor chip is mounted on a printed circuit board (PCB), according to an exemplary embodiment.

Referring to FIGS. 1 through 3, the semiconductor device 300 may include a first chip 10, a second chip 20 stacked on the first chip 10, an underfill portion 28 covering a space between the first chip 10 and the second chip 20 and covering sidewalls 30 of the second chip 20, and a molding portion 29 separated from the second chip 20 by the underfill portion 28.

In certain exemplary embodiments described below, chips 10 and 20 are described as semiconductor substrates including integrated circuits (ICs). However, the term "chip" referred to herein does not necessarily mean semiconductor chip and does not necessarily require an IC. A chip may be a material cut from a wafer and used as a layer in a semiconductor device, such as semiconductor device 300, whether or not the chip is made of a semiconductor material or includes an IC. In certain embodiments, for example, a chip, such as first chip 10, may be formed of a semiconductor material. However, in other embodiments, a chip such as first chip 10 may be formed of a glass material or other non-conductive material.

In the description below, chips 10 and 20 are referred to as semiconductor chips cut from wafers. However, as discussed previously, one of more of these chips may be formed other material and may or may not include an IC. In one embodiment, the first chip 10 is a semiconductor chip 10 that includes a first semiconductor substrate 11 and through vias 12 which penetrate the first semiconductor substrate 11.

The first semiconductor substrate 11 may be, but is not limited to, a silicon substrate, a silicon-on-insulator (SOI) substrate, or a silicon germanium substrate. The first semiconductor substrate 11 may have a first surface 11a and a second surface 11b, which is different from the first surface 11a. The first surface 11a may be referred to as an upper surface, and the second surface 11b may be referred to as a lower surface. In one embodiment, the first surface 11a may be an active surface on which an integrated circuit 111 is placed, and the second surface 11b may be a back side which is opposite the first surface 11a. An integrated circuit may not be formed on the second surface 11b. When necessary, a redistribution layer (RDL) may be formed on the second surface 11b.

In certain embodiments, the integrated circuit 111 may include a memory circuit or a logic circuit. Integrated circuit 111 may include, for example, one or more transistors, interconnections, or combination of transistors and interconnections. For example, the integrated circuit 111 may include at least one of a random access memory (RAM), a nonvolatile memory, a memory control circuit, an application processor circuit, a power supplier circuit, a modem or radio frequency (RF) circuit, a central processing unit (CPU), and an interposer including a wiring pattern.

The integrated circuit 111 may be connected to each of chip pads 15 and each of the through vias 12 by a conductive material pattern such as internal wiring pattern 112. The internal wiring pattern 112 may include, for example, a contact via 113 and a wiring pattern 114. In one embodiment, through vias 12 may connect to respective conductive members through respective conductive pads 25.

In one embodiment, the integrated circuit 111 and the internal wiring pattern 112 may be covered by an interlayer insulating film 17. The interlayer insulating film 17 may include one layer, or a plurality of insulating film layers that contain an insulating material. A passivation film 18 exposing the chip pads 15 may be disposed on the interlayer insulating film 17.

Each of the through vias 12 may include a via insulating film 13 and a via electrode 14. The via insulating film 13 is disposed on a wall of a via hole 116 which penetrates and passes through the first semiconductor substrate 11, and the via electrode 14 is disposed on the via insulating film 13 and fills the via hole 116. The via insulating film 13 may contain, e.g., silicon oxide, and the via electrode 14 may contain, e.g., copper. However, the present disclosure is not limited thereto. Although not shown in the drawings, a barrier layer may be interposed between the via insulating film 13 and the via electrode 14. The barrier layer can prevent a conductive material contained in the via electrode 14 from diffusing to the first semiconductor substrate 11. When the via electrode 14 is formed by plating, a seed layer (not shown) may be interposed between the barrier layer and the via electrode 14.

A back side insulating film 19 exposing the through vias 12 may be disposed on the second surface 11b of the first semiconductor substrate 11. The back side insulating film 19 can prevent the first semiconductor substrate 11 from being contaminated by a conductive material in the process of forming the through vias 12. In one embodiment, the back side insulating film 19 may include a plurality of layers of insulating films. For example, the back side insulating film 19 may include at least one of a silicon oxide film, a silicon nitride film, and a silicon oxynitride film.

Referring to FIG. 4, in one embodiment, a redistribution line, RDL 115 electrically connected to the via electrode 14 may be formed on the second surface 11b. If the RDL 115 is formed, each of second conductive members 26 of the second semiconductor chip 20 may be situated on the RDL 115.

First conductive members 16 may be formed on the chip pads 15, respectively. In one embodiment, the first conductive members 16 may be selected from the group consisting of conductive bumps, conductive spacers, solder balls, pin grid arrays (PGAs), and a combination of the same.

The underfill portion 28 may protect the second conductive members 26 or the second semiconductor chip 20 from external moisture and fix the second semiconductor chip 20 to the first semiconductor chip 10. In one embodiment, the underfill portion 28 covers the space between the first semiconductor chip 10 and the second semiconductor chip 20 and the sidewalls 30 of the second semiconductor chip 20. The underfill portion 28 may cover the entire sidewalls 30 of the second semiconductor chip 20. The underfill portion 28 may be comprised of a homogeneous integral underfill material, for example, an epoxy resin or silica and resin combination, formed as a single continuous structure. In one embodiment, the underfill material may include the epoxy resin and a metal oxide (e.g., $Al_2O_3$). In one embodiment, the underfill material may include the silica and resin combination, and $Al_2O_3$. In one embodiment, a homogeneous integral underfill material may be interposed between the first chip 10 and the second chip 20, encapsulating the conductive members 26 and extending along sidewalls of the second chip. In one embodiment, the underfill material may extend along the entire sidewalls of the second chip. The underfill material may have a first upper surface 28a extending in a direction parallel to an upper surface 21a of the second chip and located adjacent the upper surface of the second chip on a first side of the second chip 20, and may include a second upper surface 28b extending in a direction parallel to the upper surface 21a of the second chip 20 and located adjacent the upper surface of the second chip 20 on a second side of the second chip 20 opposite the first side. In one embodiment, the first upper surface 28a has a larger area than the second upper surface 28b, as described further below. In one embodiment, the underfill portion 28 is formed between the sidewalls 30 of the second semiconductor chip 20 and the molding portion 29, and the molding portion 29 is separated from the second semiconductor chip 20 by the underfill portion 28.

For example, a molding material may be included on outer side surfaces of the homogeneous integral underfill material above the upper surface 11b of the first chip, and may be separated from sidewalls of the second chip by underfill material such that the molding material does not contact sidewalls of the second chip. In addition, though not shown, the molding material could extend above an upper surface of the second chip, such that it contacts at least a portion of the upper surface of the second chip. This molding material portion could be thin, such as, for example, 5 μm or less. In one embodiment, molding portion 29 is included along outer side surfaces of underfill material 28, but the underfill material 28 extends horizontally at the top surface 11b of the first chip 10 all the way to the edge of the first chip 10, such that none of the underfill material 28 contacts a top surface 11b of the first chip 10. The amounts of underfill material and molding material could vary, according to certain embodiments. For example, a ratio of the volume of the molding material used to the volume of underfill material used could be a certain amount (e.g., less than 2, less than 1, or more than 2, more than 1, etc.). In an alternative embodiment, however, no molding material is used for semiconductor device 300.

Specifically, in one embodiment, a second semiconductor substrate 21 of the second semiconductor chip 20 contacts the underfill portion 28 but does not contact the molding portion 29. In one exemplary embodiment, the second semiconductor substrate 21, the underfill portion 28, and the molding portion 29 are disposed such that the coefficient of thermal expansion (CTE) increases in the order of the second semiconductor substrate 21, the underfill portion 28, and the molding portion 29. In addition, in one embodiment, the moduli of the underfill portion 28 and the molding portion 29 are smaller than the modulus of the second semiconductor substrate 21.

For example, when the second semiconductor substrate 21 is a silicon substrate, the silicon substrate may have a CTE of approximately 3.2 ppm/K and a modulus of 30 GPa or more. In this case, the underfill portion 28 may be formed using epoxy resin with a CTE of approximately 10 to 20 ppm/K and a modulus of 5 to 10 GPa, and the molding portion 29 may be formed using epoxy molding compound (EMC) with a CTE of approximately 30 to 100 ppm/K and a modulus of 20 GPa. Accordingly, in certain embodiments, a CTE ratio between the CTE of the second semiconductor substrate 21 and the CTE of the underfill may be between 0.16 and 0.32, as opposed to a CTE ratio between the CTE of the second semiconductor substrate 21 and the CTE of molding portion 29, which may be as low as 0.03 to 0.11. Further, an overall CTE of the of the semiconductor device 300, as a result of the CTEs of the various elements described above, may be less than a certain approximate amount (e.g., 6 ppm/K, 4 ppm/K, etc.).

In one embodiment, the underfill portion 28 and the molding portion 29 may be made of silicon hybrid materials. In this case, the CTE of the silicon hybrid material that forms the underfill portion 28 may be smaller than that of the silicon hybrid material that forms the molding portion 29.

A case where the second semiconductor chip 20 is stacked on the first semiconductor substrate 11 and a case where the second semiconductor chip 20 is stacked on a PCB 400 will now be described with reference to FIGS. 2 and 7.

First, the case where the second semiconductor chip 20 is stacked on the PCB 400 will be described. In one embodiment, the PCB 400 may have a CTE of approximately 10 to 20 ppm and a modulus of several GPa. An underfill portion 401 may have a CTE of approximately 10 to 20 ppm and a modulus of 5 to 10 GPa.

The warpage of a semiconductor device can be judged from the degree of stress, and stress can be calculated by multiplying the difference in CTE, the modulus, and the variation in thickness. When the PCB 400 is disposed under the second semiconductor chip 20, the difference between the CTE of the PCB 400 and that of the underfill portion 401 is small, and the modulus of the underfill portion 401 is smaller than that of the second semiconductor substrate 21. Therefore, the CTE and modulus of a molding portion 402 may not affect, or may have only a small effect on the warpage of the semiconductor device.

On the other hand, in the case where the second semiconductor chip 20 is stacked on the first semiconductor chip 10 including the first semiconductor substrate 11 as shown in FIG. 2, the first semiconductor substrate 11 has a CTE of approximately 3.2 ppm which is significantly different from the value of approximately 10 to 20 ppm for the underfill portion 28. In addition, the first semiconductor substrate 11 has a relatively high modulus of 30 GPa or more. Therefore, the semiconductor device 300 is likely to warp. To prevent the warpage of the semiconductor device 300, in one exemplary embodiment, the second semiconductor substrate 21, the underfill portion 28, and the molding portion 29 formed on the first semiconductor substrate 11 are disposed such that the CTE increases in the order of the second semiconductor substrate 21, the underfill portion 28 and the molding portion 29. That is, the second semiconductor substrate 21 has a certain CTE, the underfill portion 28 has an even higher CTE, and the molding portion 29 has an even higher CTE than the underfill portion 28. As such, in one embodiment, a CTE of the chip stack may be relatively small compared to the CTE of the molding portion 29, such as, for example, approximately 6 ppm/K. Furthermore, materials for the underfill portion 28 and the molding portion 29 may be selected such that the moduli of the underfill portion 28 and the molding portion 29 are smaller than the modulus of the second semiconductor substrate 21. Consequently, the warpage of the semiconductor device 300 can be prevented or reduced.

If the second semiconductor chip 20 is stacked on the first semiconductor chip 10 having the through vias 12, it may connect to the first semiconductor chip 10 through conductive members 26, and heat may be generated at the surface of connection between the first semiconductor chip 10 and the second semiconductor chip 20. As a result, the generated heat may cause the second semiconductor substrate 21, the underfill portion 28, and the molding portion 29 to expand. When materials significantly different in CTE are in contact with each other, exfoliation may occur at an interface between them.

Therefore, in one embodiment, the underfill portion 28 whose CTE is greater than that of the second semiconductor substrate 21 and smaller than that of the molding portion 29 is interposed between the second semiconductor substrate 21 and the molding portion 29 to be in contact with a lower surface and the sidewalls 30 of the second semiconductor chip 20. As a result, the underfill portion 28 can reduce the risk of exfoliation at an interface between the molding portion 29 and the second semiconductor chip 20 due to the difference between the CTE of the molding portion 29 and that of the second semiconductor chip 20. Additionally, since the underfill portion 28 contacts the molding portion 29, a bonding area can be secured.

In the embodiment of FIG. 2, an upper surface 21a of the second semiconductor substrate 21 is exposed from the underfill portion 28 and the molding portion 29. Accordingly, the upper surface 21a of the second semiconductor substrate 21, upper surfaces 28a and 28b of the underfill portion 28, and an upper surface 29a of the molding portion 29 may be coplanar. That is, the upper surface 21a of the second semiconductor substrate 21, the upper surfaces 28a and 28b of the underfill portion 28, and the upper surface 29a of the molding portion 29 may be formed as a single surface without a step therebetween or any significant variation in height, and thus may be coplanar. The different portions may be made coplanar, for example, as a result of a grinding process that planarizes the top surfaces of the portions together.

Figure 5A:
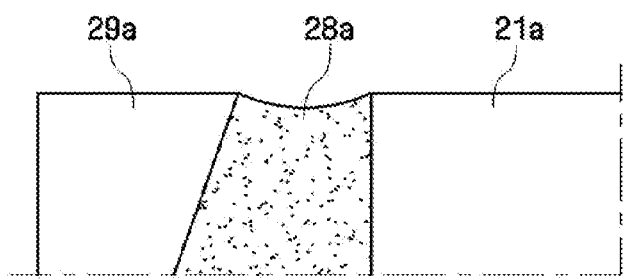
FIGS. 5A, 5B, 6A and 6B are enlarged views illustrating modified embodiments of a portion B shown in FIG. 2, according to certain exemplary embodiments.
Figure 5B:
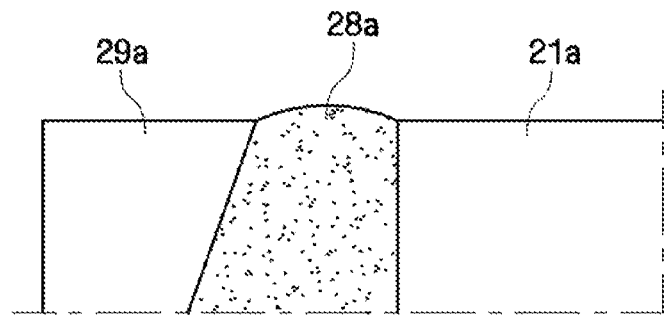

For example, as shown in FIG. 2, the upper surface 21a of the second semiconductor substrate 21, the upper surfaces 28a and 28b of the underfill portion 28, and the upper surface 29a of the molding portion 29 may be substantially flat and have equal heights. Alternatively, referring to FIGS. 5A and 5B, the upper surface 28a (and/or 28b, not shown) of the underfill portion 28 may be curved. The upper surfaces 28a and/or 28b of the underfill portion 28 may be a concave curved surface as shown in FIG. 5A or may be a convex curved surface as shown in FIG. 5B. In the exemplary embodiments of FIGS. 5A and 5B, a process of lapping the underfill portion 28 may be used. As a result, the upper surfaces 28a and/or 28b of the lapped underfill portion 28 may be curved. In one embodiment, the curvature may be such that for each of the entire upper surface of the molding material, the entire upper surface of the homogeneous integral underfill material, and the entire upper surface of the upper surface of the second chip, any portion of each surface lies within a small vertical distance from a first plane, such as, for example, 5 μm.

Figure 6A:
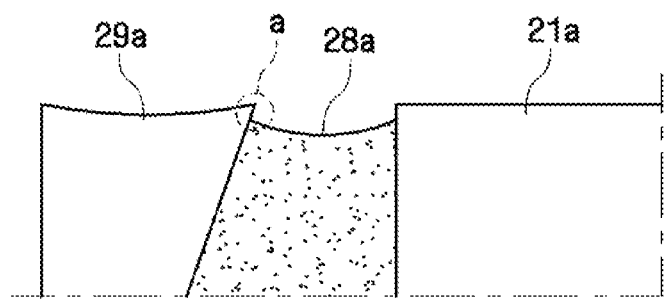
Figure 6B:
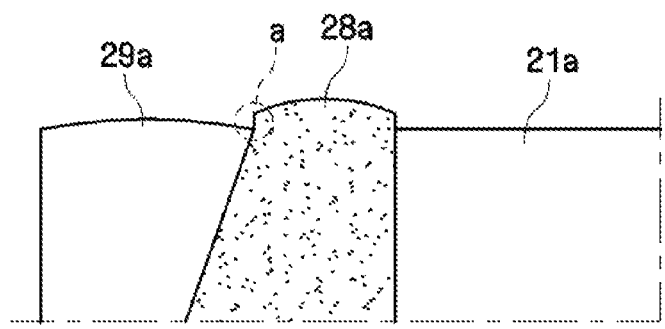
Figure 7:
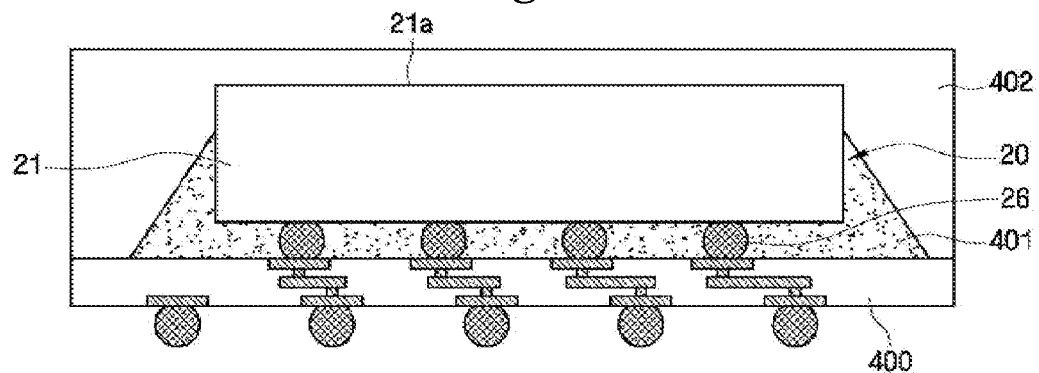
FIG. 7 is a diagram illustrating a case where a semiconductor chip is mounted on a printed circuit board (PCB), according to an exemplary embodiment.

Referring to FIGS. 6A and 6B, a step a may be formed between the upper surface 28a (and/or 28b, not shown) of the underfill portion 28 and the upper surface 29a of the molding portion 29. For example, when the underfill portion 28 and the molding portion 29 which are formed of different materials are lapped simultaneously, the step a may be formed between the upper surface 28a of the underfill portion 28 and the upper surface 29a of the molding portion 29 due to the difference between an etch rate of the underfill portion 28 and that of the molding portion 29. In addition, the upper surface 28a of the underfill portion 28 and the upper surface 29a of the molding portion 29 may be curved. Upper surface 28b may have similar steps and/or curves as upper surface 28a.

In one embodiment, a length (e.g., d3) of the upper surface 28a of the underfill portion 28 in a horizontal direction X from one of the sidewalls 30 of the second semiconductor chip 20 may be shorter than a length (e.g., d2) of the lower surface of the underfill portion 28 at the upper surface 11b of the first semiconductor chip 10 in a horizontal direction X from the one of the sidewalls 30 of the second semiconductor chip 20. The distances d3 and d2 (or d1 and d4 with respect to upper surface 28b) may have a certain maximum ratio to each other, such as for example, a maximum d3:d2 could be 0.3. In other words, with respect to a vertical cross sectional profile of the semiconductor device 300, the homogeneous integral underfill material may extend a first distance d2 (or d4) along the upper surface 11b of the first chip 10, wherein the first distance d2 is from a first location directly under a first sidewall 30 of the second chip 20 to a second location at an edge of the underfill material at the upper surface 11b of the first chip 10 that is not under the second chip 20 (e.g., where the underfill portion 28 meets the molding portion 29). The homogeneous integral underfill material may include an upper surface 28a (or 28b) that extends a second distance d3 (or d1) from the first (or second) sidewall 30. In one embodiment, the ratio of the second distance d3 to the first distance d2 could be 0.5 or lower, and/or the ratio of the second distance d1 to the first distance d4 could be 0.3 or lower, in order to minimize warping while still maintaining sufficient molding material to strengthen the overall package.

In one embodiment, a length d1 of the upper surface 28b of the underfill portion 28 in a horizontal direction X from one of the sidewalls 30 of the second semiconductor chip 20 may be at least 5 μm. That is, a minimum length d1 of the upper surface 28b of the underfill portion 28 in the horizontal direction X from the sidewall 30 of the second semiconductor chip 20 to where the underfill portion meets the molding portion 29 may be 5 μm (though the length d1 may be as much as 100 μm or greater). As a result, when the thickness d1 of the upper surface 28b of the underfill portion 28 in the horizontal direction X from the sidewall 30 of the second semiconductor chip 20 is 5 μm or more, the warpage of the semiconductor device 300 and the risk of exfoliation at interfaces between the second semiconductor substrate 21, the underfill portion 28 and the molding portion 29 can be minimized. If a resin filler, which may be contained in the material of the underfill portion 28 to secure resin strength, is several μm in size and if underfill material thickness is less than 5 μm, it may be difficult to contain the resin filler in the material.

The underfill portion 28 may be formed, in one embodiment, by placing a dispenser, which contains a liquid underfill material, on a side of the second semiconductor chip 20 and injecting the liquid underfill material from the dispenser into a space between the second semiconductor chip 20 and the first semiconductor chip 10. In one embodiment, in a region of the underfill portion 28 formed on the side of the second semiconductor chip 20 on which the dispenser is placed, a length d3 of the upper surface 28a of the underfill portion 28 in the horizontal direction X from one of the sidewalls 30 of the second semiconductor chip 20 may be greater than a length of the upper surface in the other regions of the underfill portion 28. That is, the length d1 of the upper surface 28b of the underfill portion 28 in the horizontal direction X from one of the sidewalls 30 of the second semiconductor chip 20 may be different from the length d3 of the upper surface 28a of the underfill portion 28 in the horizontal direction X from another one of the sidewalls 30 of the second semiconductor chip 20.

Sidewalls of the underfill portion 28 may be tapered from the upper surface 21a of the second semiconductor substrate 21 toward a lower surface thereof. That is, thicknesses of the sidewalls of the underfill portion 28 in the horizontal direction X from the sidewalls 30 of the second semiconductor substrate 21 may increase from the upper surface 21a of the second semiconductor substrate 21 toward the lower surface thereof.

Thicknesses d2 and d4 of the underfill portion 28 in the horizontal direction X from the sidewalls 30 of the second semiconductor chip 20 at a contact surface between the first semiconductor chip 10 and the underfill portion 28 may be, for example, 500 to 700 μm. In the region of the underfill portion 28 which may be thicker than the other regions adjacent sidewalls of the second semiconductor chip 20, the thickness d2 of the underfill portion 28 in the horizontal direction X from one of the sidewalls 30 of the second semiconductor chip 20 at the contact surface between the first semiconductor chip 10 and the underfill portion 28 may be, for example 700 μm or less. In one embodiment, the thickness d2 of the underfill portion 28 in the horizontal direction X from one of the sidewalls 30 of the second semiconductor chip 20 at the contact surface between the first semiconductor chip 10 and the underfill portion 28 in the region of the underfill portion 28 may be greater than the thickness d4 of the underfill portion 28 in the horizontal direction X from another one of the sidewalls 30 of the second semiconductor chip 20 at the contact surface between the first semiconductor chip 10 and the underfill portion 28 in another region of the underfill portion 28.

When the thickness d2 of the underfill portion 28 in the horizontal direction X from one of the sidewalls 30 of the second semiconductor chip 20 at the contact surface between the first semiconductor chip 10 and the underfill portion 28 is 700 μm or less, a maximum bonding area between the molding portion 29 and the first semiconductor chip 10 can be secured. If the thickness d2 of the underfill portion 28 exceeds 700 μm, mechanical stress applied to the first semiconductor chip 10 sharply increases, causing the first semiconductor chip 10 to warp, which, in turn, may result in chip cracks and joint defects between upper and lower chips. For this reason, the thickness d2 of the underfill portion 28 may be maintained at 700 μm or less.

In one embodiment, the second semiconductor chip 20 includes through vias (not shown). However, in an alternative embodiment, second semiconductor chip 20 may not have through vias.

Figure 8:
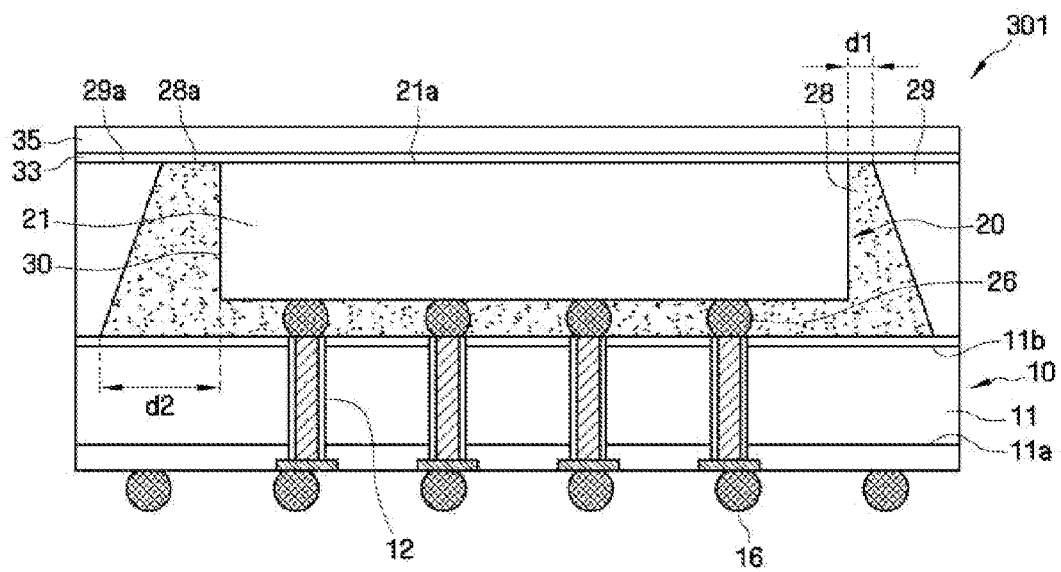
FIG. 8 is a cross-sectional view of a semiconductor device according to another exemplary embodiment.

Hereinafter, a semiconductor device according to another exemplary embodiment will be described with reference to FIG. 8. FIG. 8 is a cross-sectional view of a semiconductor device 301 according to one exemplary embodiment. Elements substantially identical to those illustrated in FIGS. 1 through 6 are indicated by like reference numerals, and thus a detailed description thereof will be omitted.

Referring to FIG. 8, the semiconductor device 301 may further include a thermal interface material (TIM) 33, which has adhesive characteristics and is in contact with an upper surface 21a of a second semiconductor substrate 21, and a heat sink 35 which is in contact with the TIM 33. The heat sink 35 may contain a material having high thermal conductivity. For example, the heat sink may include a metal plate. The TIM 33 and the heat sink 35 may extend onto an upper surface 28a of an underfill portion 28 and an upper surface 29a of a molding portion 29. The TIM 33 may be, for example, a curable adhesive material containing particles of metal (such as Ag) or metal oxide (such as $Al_2O_3$) in epoxy resin or thermal grease paste containing particles of diamond, AlN, $Al_2O_3$, ZnO, or Ag.

Since the upper surface 21a of the second semiconductor substrate 21 and the heat sink 35 are in contact with the TIM 33, the heat dissipation effect can be increased.

Figure 9:
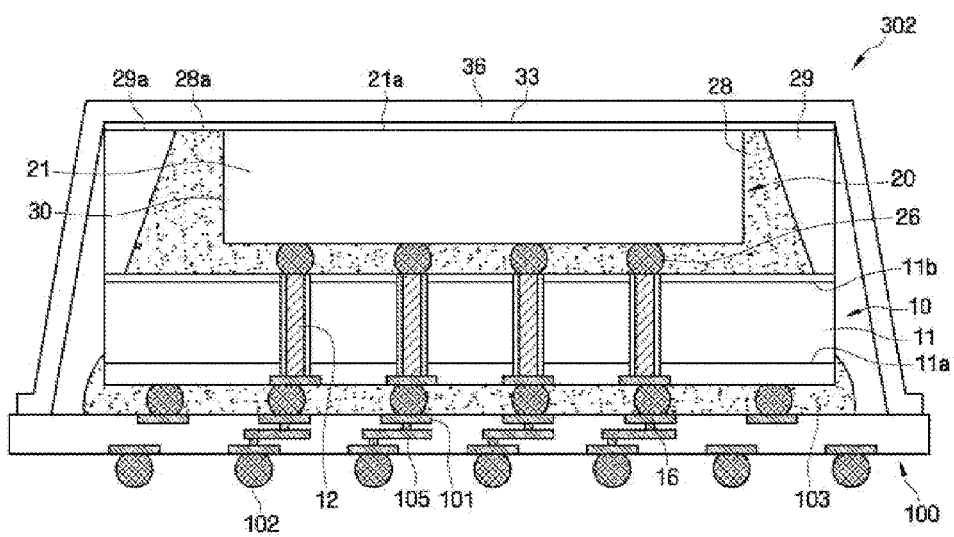
FIG. 9 is a cross-sectional view of a semiconductor device according to another exemplary embodiment.

Hereinafter, a semiconductor device according to another exemplary embodiment will be described with reference to FIG. 9. FIG. 9 is a cross-sectional view of a semiconductor device 302 according to another exemplary embodiment. Elements substantially identical to those illustrated in FIGS. 1 through 8 are indicated by like reference numerals, and thus a detailed description thereof will be omitted.

Referring to FIG. 9, in the semiconductor device 302, the semiconductor device 300 shown in FIG. 2 is mounted on a package substrate 100. The package substrate 100 may include circuit patterns 105 connected to a first chip 10 and a second chip 20. The first chip 10 and the second chip 20 may be electrically connected to a device outside the semiconductor device 302 by the circuit patterns 105. The package substrate 100 may be, for example, a PCB or a film substrate having the circuit patterns 105. The package substrate 100 may include bonding pads 101 to which first conductive members 16 can be connected, respectively.

The package substrate 100 may further include conductive members 102 used to connect the semiconductor device 302 to an external device. For example, the semiconductor device 302 may be mounted on a set board (not shown) by the conductive members 102. In another example, the package substrate 100 may be a system board. When the first and second chips 10 and 20 are wafer-level packages (WLPs), they may be mounted on a system board without requiring the package substrate 100.

A filler 103 may be interposed between the package substrate 100 and the first chip 10. The filler 103 may fix the first chip 10 to the package substrate 100. The filler 103 may contain an underfill material, such as a homogeneous integral underfill material as described above.

In the semiconductor device 302, a heat sink 36 may extend from an upper surface 21a of a second substrate 21 to an upper surface of the package substrate 100 and may be in contact with the upper surface of the package substrate 100. In one embodiment, the heat sink 36 is connected to the upper surface 21a of the second substrate 21 with a TIM 33 interposed therebetween and is in contact with the upper surface of the package substrate 100, thus further increasing the heat dissipation effect.

Figure 10:
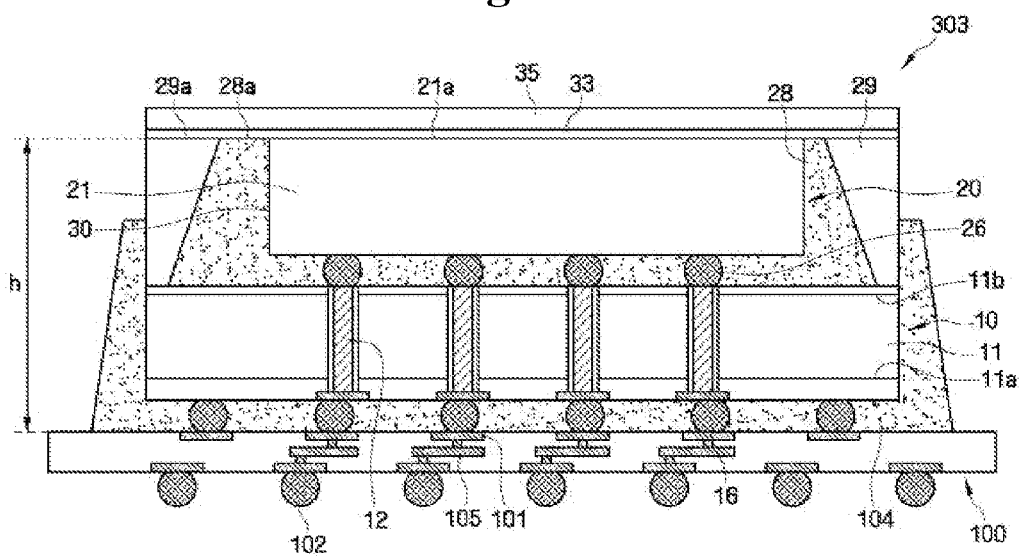
FIG. 10 is a cross-sectional view of a semiconductor device according to another exemplary embodiment.

Hereinafter, a semiconductor device according to another exemplary embodiment will be described with reference to FIG. 10. FIG. 10 is a cross-sectional view of a semiconductor device 303 according to another exemplary embodiment. Elements substantially identical to those illustrated in FIGS. 1 through 9 are indicated by like reference numerals, and thus a detailed description thereof will be omitted.

Referring to FIG. 10, in the semiconductor device 303, a filler 104 formed between a package substrate 100 and a first chip 10 may surround sidewalls of the first chip 10 and at least part of a molding portion 29 which surrounds a second chip 20. When a height from an upper surface of the package substrate 100 to an upper surface 29a of the molding portion 29 is h, a height from the upper surface of the package substrate 100 to an upper surface of the filler 104 may be 0.7 h or more. If the height of the filler 104 is less than 0.7 h, the filler 104 may not reach the sides of the second chip 20, and thus may be unable to fully support the second chip 20. Even when the filler 104 reaches part of a lower portion of the second semiconductor chip 20, an upper portion of the filler 104 may not be thick enough, that is, may have a thickness of only several μm. Therefore, in one embodiment, the filler 104 may be formed to be higher than second conductive members 26 of the second chip 20, that is, formed to a height of 0.7 h or more in order to more fully support the second chip 20.

Figure 11:
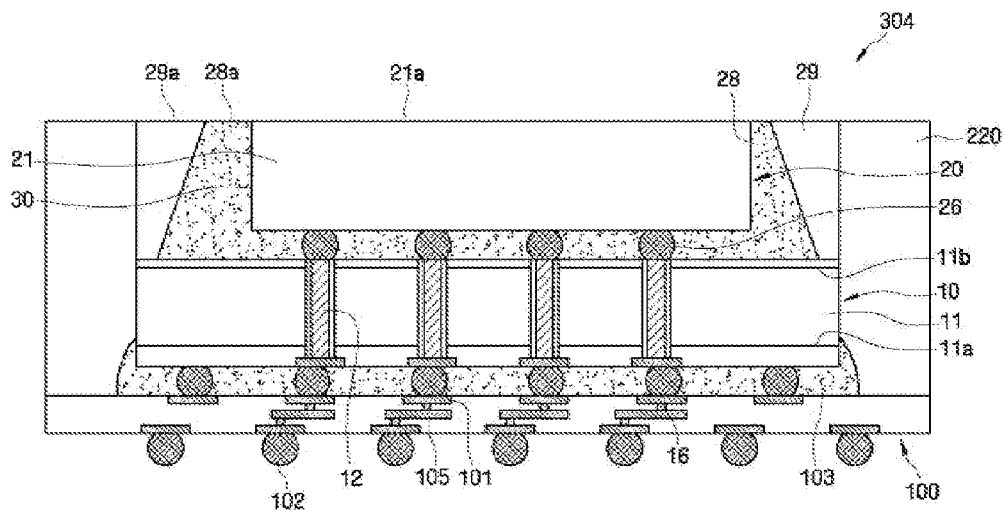
FIG. 11 is a cross-sectional view of a semiconductor device according to another exemplary embodiment.

Hereinafter, a semiconductor device according to another exemplary embodiment will be described with reference to FIG. 11. FIG. 11 is a cross-sectional view of a semiconductor device 304 according to another exemplary embodiment. Elements substantially identical to those illustrated in FIGS. 1 through 10 are indicated by like reference numerals, and thus a detailed description thereof will be omitted.

Referring to FIG. 11, the semiconductor device 300 shown in FIG. 2 is mounted on a package substrate 100 in the semiconductor device 304. The semiconductor device 304 further includes a package molding portion 220 which molds the semiconductor device 300 shown in FIG. 2. The molding portion 220 may contact and surround a molding portion 29 as well as sidewalls of the first chip 10 of the semiconductor device 300 of FIG. 2, and may further contact and surround filler 103.

Figure 12:
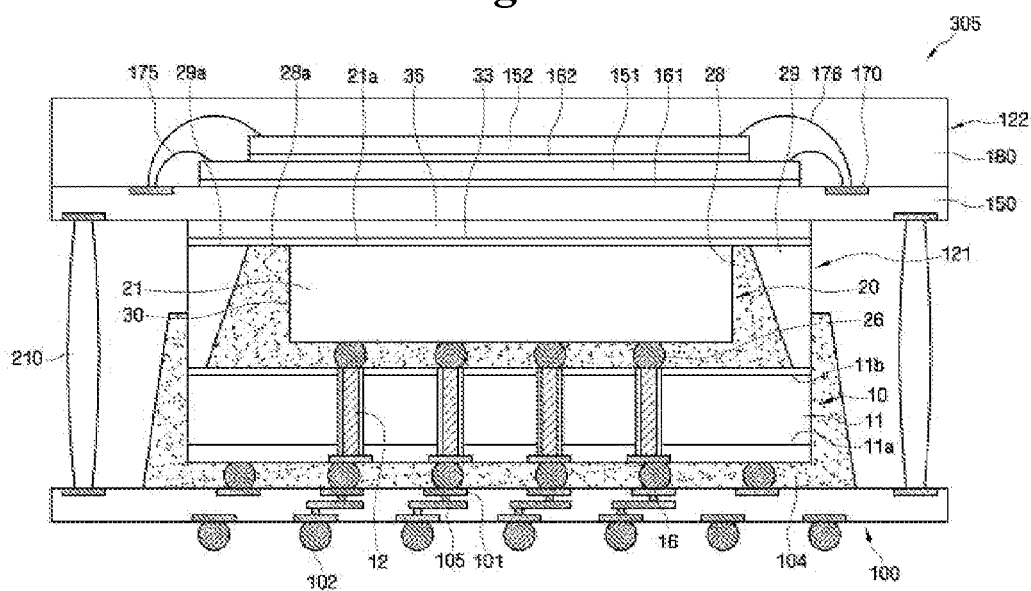
FIG. 12 is a cross-sectional view of a semiconductor device according to another exemplary embodiment.

Hereinafter, a semiconductor device according to another exemplary embodiment will be described with reference to FIG. 12. FIG. 12 is a cross-sectional view of a semiconductor device 305 according to another exemplary embodiment. Elements substantially identical to those illustrated in FIGS. 1 through 11 are indicated by like reference numerals, and thus a detailed description thereof will be omitted.

Referring to FIG. 12, the semiconductor device 305 includes stacked semiconductor packages. The semiconductor device 305 includes a lower package 121 and an upper package 122 stacked on the lower package 121. Any one of the semiconductor devices 302 through 304 shown in FIGS. 9 through 11 may be used as the lower package 121. In the example shown in FIG. 12, the semiconductor device 303 shown in FIG. 10 is used as the lower package 121.

In one embodiment, the upper package 122 may include an upper substrate 150 and one or more semiconductor chips 151 and 152 mounted on the upper substrate 150. The upper substrate 150 may be, for example, a PCB, a film substrate, or the like. A first upper semiconductor chip 151 may be mounted on a surface of the upper substrate 150 by an adhesive 161, and a second upper semiconductor chip 152 may be mounted on the first upper semiconductor chip 151 by an adhesive 162.

The first and second upper semiconductor chips 151 and 152 may be electrically connected to connection pads 170 of the upper substrate 150 by wires 175 and 176. Alternatively, the chips 151 and 152 may be electrically connected by through vias. An upper encapsulant 180 may be formed on the upper substrate 150 to cover the first and second upper semiconductor chips 151 and 152 and the wires 175 and 176. In one embodiment, the semiconductor device 305 may further include joint members 210 for bonding the lower package 121 and the upper package 122 together. The joint members 210 electrically and structurally connect a package substrate 100 of the lower package 121 to the upper substrate 150 of the upper package 122.

Figure 13:
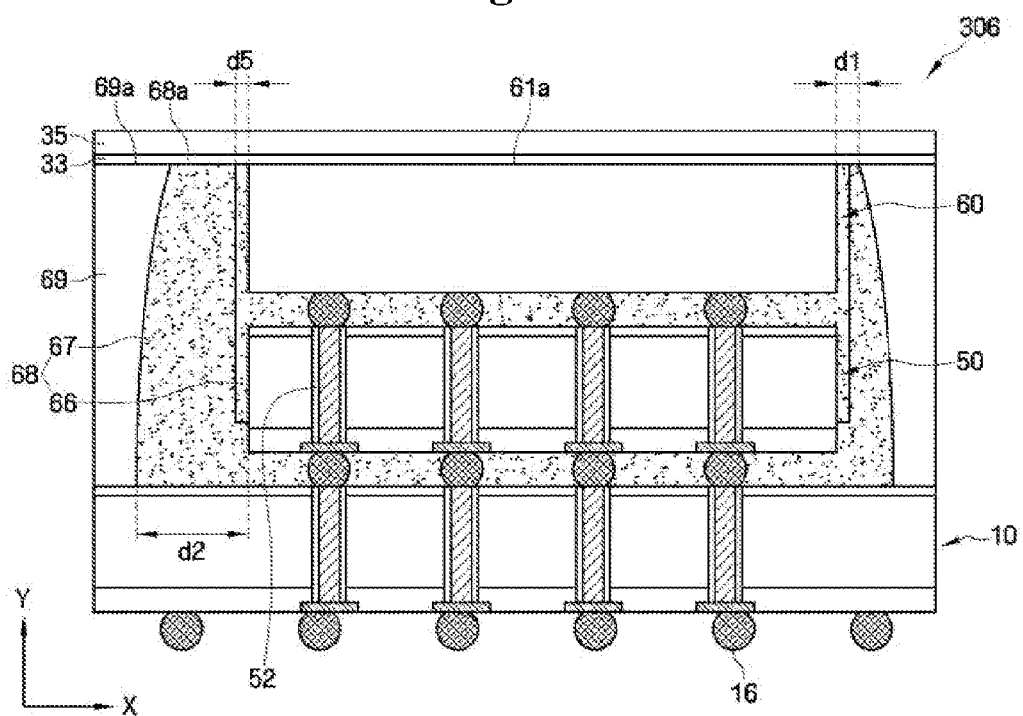
FIGS. 13 and 14 are cross-sectional views of a semiconductor device according to another exemplary embodiment.
Figure 14:
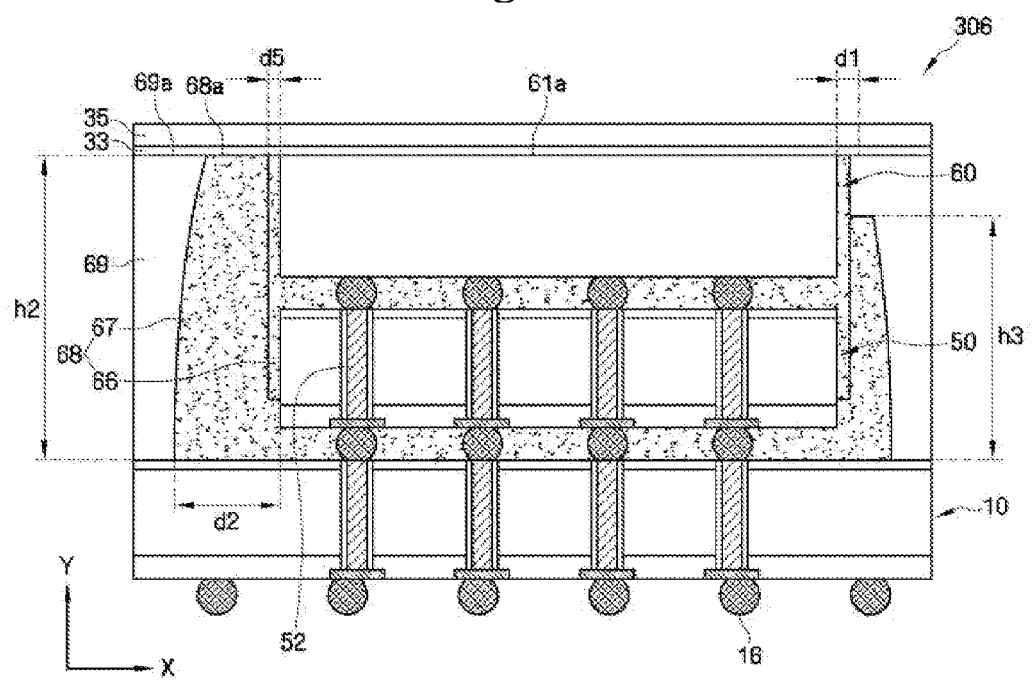

Hereinafter, a semiconductor device according to another exemplary embodiment will be described with reference to FIGS. 13 and 14. FIGS. 13 and 14 are cross-sectional views of a semiconductor device 306 according to another exemplary embodiment. Elements substantially identical to those illustrated in FIGS. 1 through 12 are indicated by like reference numerals, and thus a detailed description thereof will be omitted.

Referring to FIG. 13, the semiconductor device 306 includes a plurality of stacked chips 10, 50 and 60. In FIG. 13, three semiconductor chips are stacked. However, this is just an example—additional semiconductor chips may be stacked, and not all of the chips need to be semiconductor chips. The semiconductor device 306 may include a first semiconductor chip 10, a second semiconductor chip 50 stacked on the first semiconductor chip 10, a third semiconductor chip 60 stacked on the second semiconductor chip 50, an underfill portion 68 covering spaces between the first through third semiconductor chips 10, 50 and 60 and covering the entire sidewalls of the second and third semiconductor chips 50 and 60, and a molding portion 69 covering sidewalls of the underfill portion 68.

In one embodiment, the first semiconductor chip 10 may be identical to the first semiconductor chip 10 described above with reference to FIG. 2, and thus a detailed description thereof will be omitted. Like the first semiconductor chip 10, the second semiconductor chip 50 may include through vias 52. On the other hand, in one embodiment, the third semiconductor chip 60 at the top may not include through vias. In one embodiment, the first semiconductor chip 10 may be a logic chip such as a mobile CPU, and the second and third semiconductor chips 50 and 60 may be memory chips such as dynamic random access memories (DRAMs), wide input/output (I/O) DRAMs, flash memories, or phase-change random access memories (PRAMs). The second and third semiconductor chips 50 and 60 may be of the same type. However, other chip types or arrangements may be used.

The underfill portion 68 covers the spaces between the first through third semiconductor chips 10, 50 and 60 and the sidewalls of the second and third semiconductor chips 50 and 60. That is, the underfill portion 68 extends up to the sidewalls of the third semiconductor chip 60 at the top and covers the sidewalls of the third semiconductor chip 60. The underfill portion 68 is formed between the sidewalls of the second and third semiconductor chips 50 and 60 and the molding portion 69. The molding portion 69 is separated from the third semiconductor chip 60 by the underfill portion 68. In on embodiment, the sidewalls of the second and third semiconductor chips 50 and 60 contact the underfill portion 68. Specifically, in one embodiment, semiconductor substrates of the second and third semiconductor chips 50 and 60 contact the underfill portion 68 but do not contact the molding portion 69.

An upper surface 61a of the semiconductor substrate of the third semiconductor chip 60, which is the topmost chip among the first through third semiconductor chips 10, 50 and 60 stacked sequentially, is exposed from the underfill portion 68 and the molding portion 69.

In one embodiment, a thickness d1 of the underfill portion 68 in a horizontal direction X from a sidewall of the third semiconductor chip 60 may be at least 5 µm, and a thickness d2 of the underfill portion 68 in the horizontal direction X from another sidewall of the second semiconductor chip 50 at a contact surface between the first semiconductor chip 10 and the underfill portion 68 may be 700 µm or less.

The underfill portion 68 of the semiconductor device 306 may include a first sub-underfill portion 66 and a second sub-underfill portion 67 covering the first sub-underfill portion 66. The first sub-underfill portion 66 may be formed when the second and third semiconductor chips 50 and 60 are stacked on a carrier substrate, and the second sub-underfill portion 67 may be formed when the stacked second and third semiconductor chips 50 and 60 are stacked on the first semiconductor chip 10. The first sub-underfill portion 66 and second sub-underfill portion 67 may include the same material that forms a homogeneous integral underfill material, even though the first sub-underfill portion 66 and second sub-underfill portion 67 are formed in separate steps. However, the first sub-underfill portion 66 and second sub-underfill portion 67 may be formed of different materials, in which case they do not form a single, homogeneous integral underfill material. In one embodiment, the first sub-underfill portion 66 is not formed between a lower surface of the second semiconductor chip 50 and an upper surface of the first semiconductor chip 10. A thickness d5 of the first sub-underfill portion 66 in the horizontal direction X from a sidewall of the third semiconductor chip 60 may be equal to a thickness d5 of the first sub-underfill portion 66 in the horizontal direction X from the other sidewall of the third semiconductor chip 60.

Referring to FIG. 14, in one embodiment, a height h2 of the second sub-underfill portion 67 formed on a sidewall of the second and third semiconductor chips 50 and 60 may be different from a height h3 of the second sub-underfill portion 67 formed on another sidewall of the second and third semiconductor chips 50 and 60.

As discussed above, the first sub-underfill portion 66 and the second sub-underfill portion 67 may be the same or different materials. In one embodiment, when the first sub-underfill portion 66 and the second sub-underfill portion 67 are different materials, the CTE of the first sub-underfill portion 66 may be smaller than that of the second sub-underfill portion 67.

The semiconductor device 306 may further include a TIM 33 which contacts the upper surface 61a of the semiconductor substrate of the third semiconductor chip 60 at the top and a heat sink 35 which contacts the TIM 33. The TIM 33 and the heat sink 35 may extend onto an upper surface 68a of the underfill portion 68 and an upper surface 69a of the molding portion 69 and TIM 33 may contact the upper surface 68a of the underfill portion 68 and the upper surface 69a of the molding portion 69. In one embodiment, as shown in FIG. 14, the TIM 33 does not contact an upper surface of the second sub-underfill portion 67 on one side of the semiconductor device 306.

Figure 15:
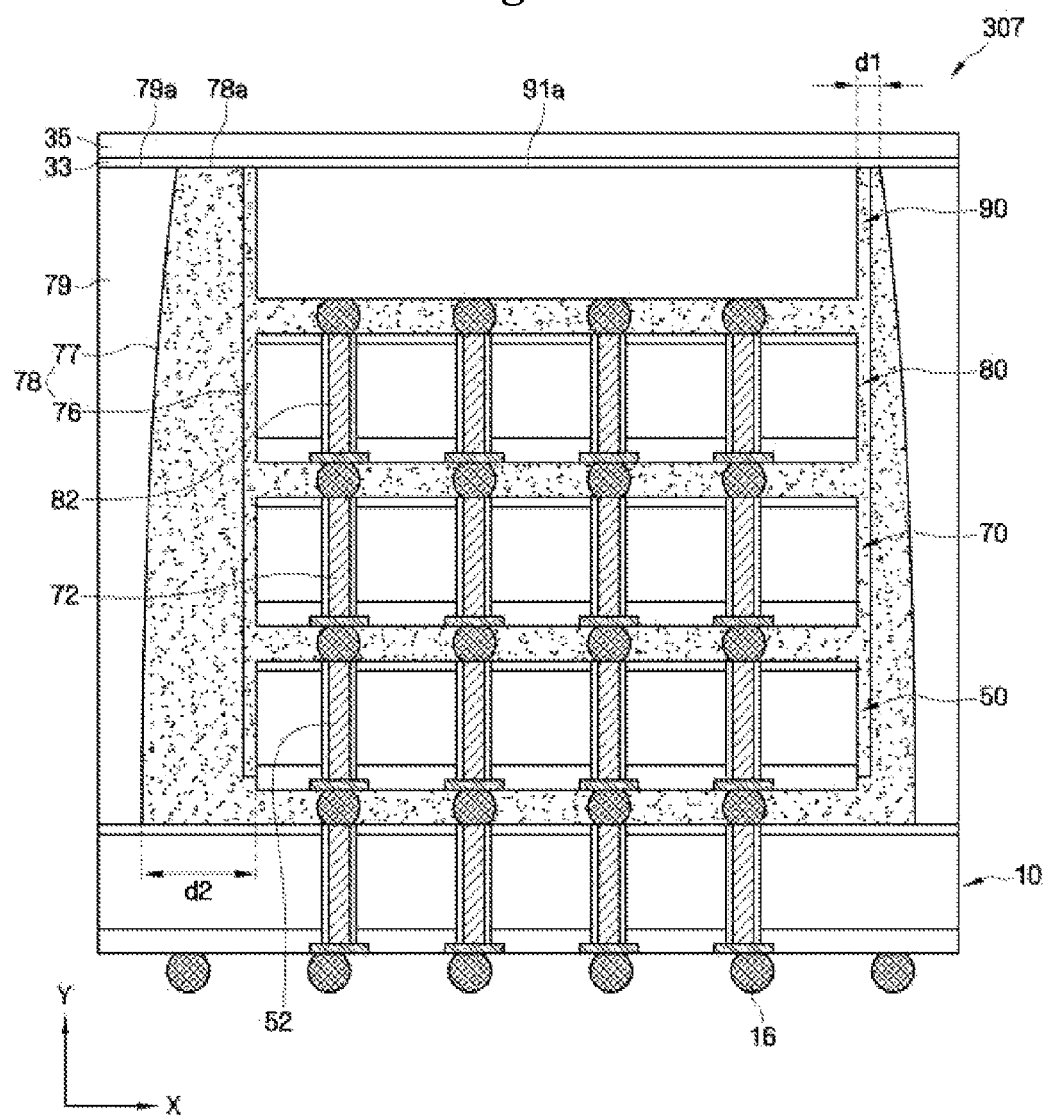
FIG. 15 is a cross-sectional view of a semiconductor device according to another exemplary embodiment.

Hereinafter, a semiconductor device according to another exemplary embodiment will be described with reference to FIG. 15. FIG. 15 is a cross-sectional view of a semiconductor device 307 according to another exemplary embodiment. Elements substantially identical to those illustrated in FIGS. 1 through 14 are indicated by like reference numerals, and thus a detailed description thereof will be omitted.

Referring to FIG. 15, the semiconductor device 307 includes a plurality of stacked chips 10, 50, 70, 80 and 90. In FIG. 15, five chips are stacked, and in one embodiment, the chips are semiconductor chips. However, this is just an example, and different numbers of chips that include semiconductor or non-semiconductor chips may be included. The semiconductor device 307 may include a first semiconductor chip 10, a second semiconductor chip 50 stacked on the first semiconductor chip 10, a third semiconductor chip 70 stacked on the second semiconductor chip 50, a fourth semiconductor chip 80 stacked on the third semiconductor chip 70, a fifth semiconductor chip 90 stacked on the fourth semiconductor chip 80. In one embodiment, the first semiconductor chip 10 is a logic chip (e.g., including a controller), and second through fourth semiconductor chips 50, 70, and 80 are memory chips. The semiconductor device 307 may further include an underfill portion 78 covering spaces between the first through fifth semiconductor chips 10, 50, 70, 80 and 90 and covering the sidewalls of the second through fifth semiconductor chips 50, 70, 80 and 90, and a molding portion 79 covering sidewalls of the underfill portion 78. In one embodiment, underfill portion 78 includes underfill material that covers the entire sidewalls of the second through fifth semiconductor chips 50, 70, 80, and 90, and molding portion 79 covers entire sidewalls of underfill portion 78.

In one embodiment, the first semiconductor chip 10 may have the same structure as the first semiconductor chip 10 described above with reference to FIG. 2, and thus a detailed description thereof will be omitted. Like the first semiconductor chip 10, the second through fourth semiconductor chips 50, 70 and 80 may include through vias 52, 72 and 82, respectively. On the other hand, in one embodiment, the fifth semiconductor chip 90 at the top may not include through vias.

The underfill portion 78 covers the spaces between the first through fifth semiconductor chips 10, 50, 70, 80 and 90 and the sidewalls of the second through fifth semiconductor chips 50, 70, 80 and 90. That is, the underfill portion 78 extends up to the sidewalls of the fifth semiconductor chip 90 at the top and covers the sidewalls of the fifth semiconductor chip 90. The underfill portion 78 is formed between the sidewalls of the second through fifth semiconductor chips 50, 70, 80 and 90 and the molding portion 79. The molding portion 79 is separated from the fifth semiconductor chip 90 at the top by the underfill portion 78. The sidewalls of the second through fifth semiconductor chips 50, 70, 80 and 90 contact the underfill portion 78. Specifically, semiconductor substrates of the second through fifth semiconductor chips 50, 70, 80 and 90 contact the underfill portion 78 but do not contact the molding portion 79.

An upper surface 91a of the semiconductor substrate of the fifth semiconductor chip 90, which is the topmost chip among the first through fifth semiconductor chips 10, 50, 70, 80 and 90 stacked sequentially, is exposed from the underfill portion 78 and the molding portion 79.

A thickness d1 of the underfill portion 78 in a horizontal direction X from a sidewall of the fifth semiconductor chip 90 may be at least 5 μm, and a thickness d2 of the underfill portion 78 in the horizontal direction X from another sidewall of the second semiconductor chip 50 at a contact surface between the first semiconductor chip 10 and the underfill portion 78 may be 700 μm or less.

The underfill portion 78 of the semiconductor device 307 may include a first sub-underfill portion 76 and a second sub-underfill portion 77 covering the first sub-underfill portion 76. The first sub-underfill portion 76 may be formed when the second through fifth semiconductor chips 50, 70, 80 and 90 are stacked on a carrier substrate, and the second sub-underfill portion 77 may be formed when the stacked second through fifth semiconductor chips 50, 70, 80 and 90 are stacked on the first semiconductor chip 10. The first sub-underfill portion 76 and the second sub-underfill portion 77 may be the same or different materials. When the first sub-underfill portion 76 and the second sub-underfill portion 77 are the same materials, they form a homogeneous integral underfill material. When the first sub-underfill portion 76 and the second sub-underfill portion 77 are different materials, the CTE of the first sub-underfill portion 66 may be smaller than that of the second sub-underfill portion 67.

The semiconductor device 307 may further include a TIM 33, which has adhesive characteristics and is in contact with the upper surface 91a of the semiconductor substrate of the fifth semiconductor chip 90 at the top and a heat sink 35 which is in contact with the TIM 33. The TIM 33 and the heat sink 35 may extend onto an upper surface 78a of the underfill portion 78 and an upper surface 79a of the molding portion 79.

Figure 16:
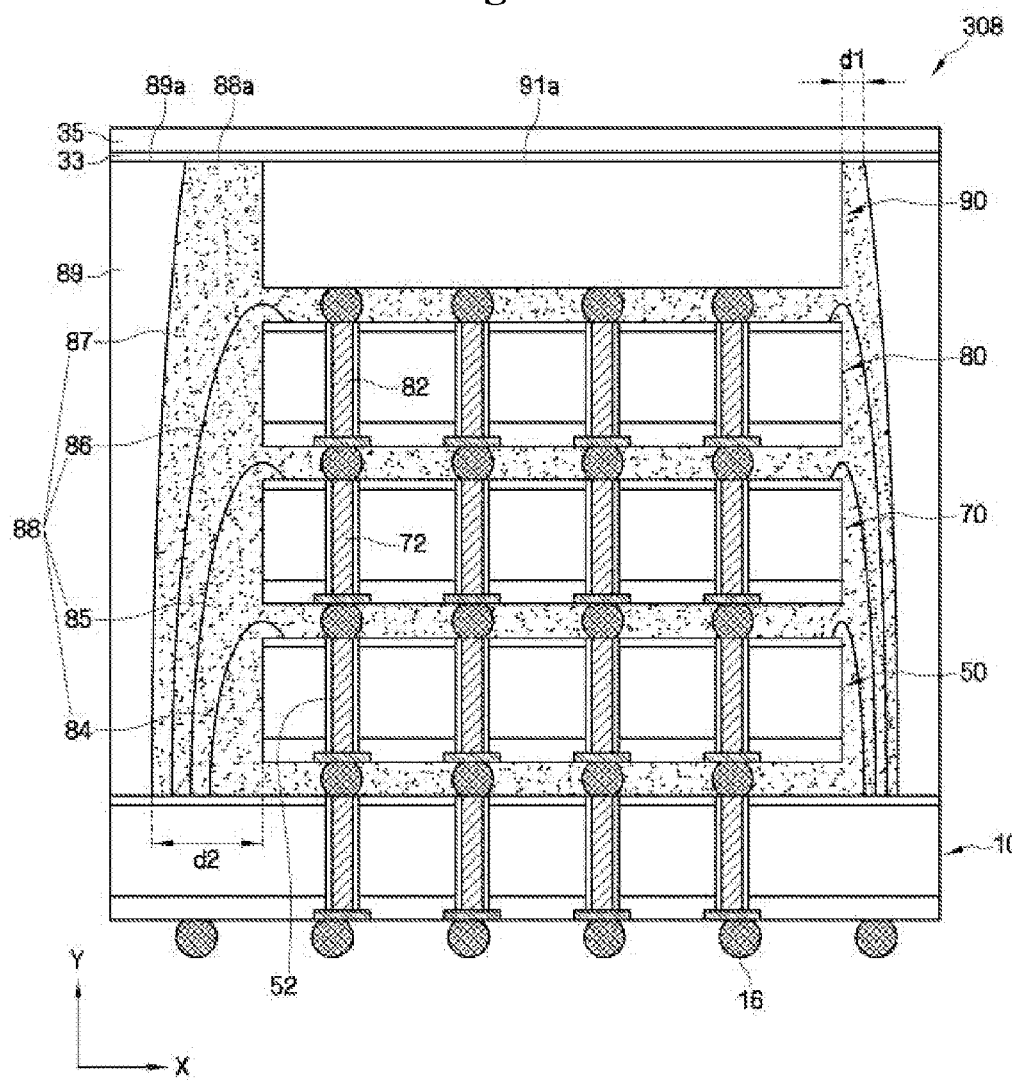
FIG. 16 is a cross-sectional view of a semiconductor device according to another exemplary embodiment.

Hereinafter, a semiconductor device according to another exemplary embodiment will be described with reference to FIG. 16. FIG. 16 is a cross-sectional view of a semiconductor device 308 according to another exemplary embodiment. Elements substantially identical to those illustrated in FIGS. 1 through 15 are indicated by like reference numerals, and thus a detailed description thereof will be omitted.

Referring to FIG. 16, an underfill portion 88 of the semiconductor device 308 may include first through fourth sub-underfill portions 84 through 87, unlike the underfill portion 78 of the semiconductor device 307 (see FIG. 15). In the semiconductor device 308, second through fifth semiconductor chips 50, 70, 80 and 90 are stacked sequentially on a first semiconductor chip 10. The first sub-underfill portion 84 may be formed when the second semiconductor chip 50 is stacked on the first semiconductor chip 10, and the second sub-underfill portion 85 may be formed when the third semiconductor chip 70 is stacked on the second semiconductor chip 50. The third sub-underfill portion 86 may be formed when the fourth semiconductor chip 80 is stacked on the third semiconductor chip 70, and the fourth sub-underfill portion 87 may be formed when the fifth semiconductor chip 90 is stacked on the fourth semiconductor chip 80.

The first through fourth sub-underfill portions 84 through 87 may be the same or different materials. When the first through fourth sub-underfill portions 84 through 87 are the same materials, they form a homogeneous integral underfill material. When the first through fourth sub-underfill portions 84 through 87 are different materials, the CTE may increase in the order of the first, second, third and fourth sub-underfill portions 84, 85, 86 and 87.

Figure 17:
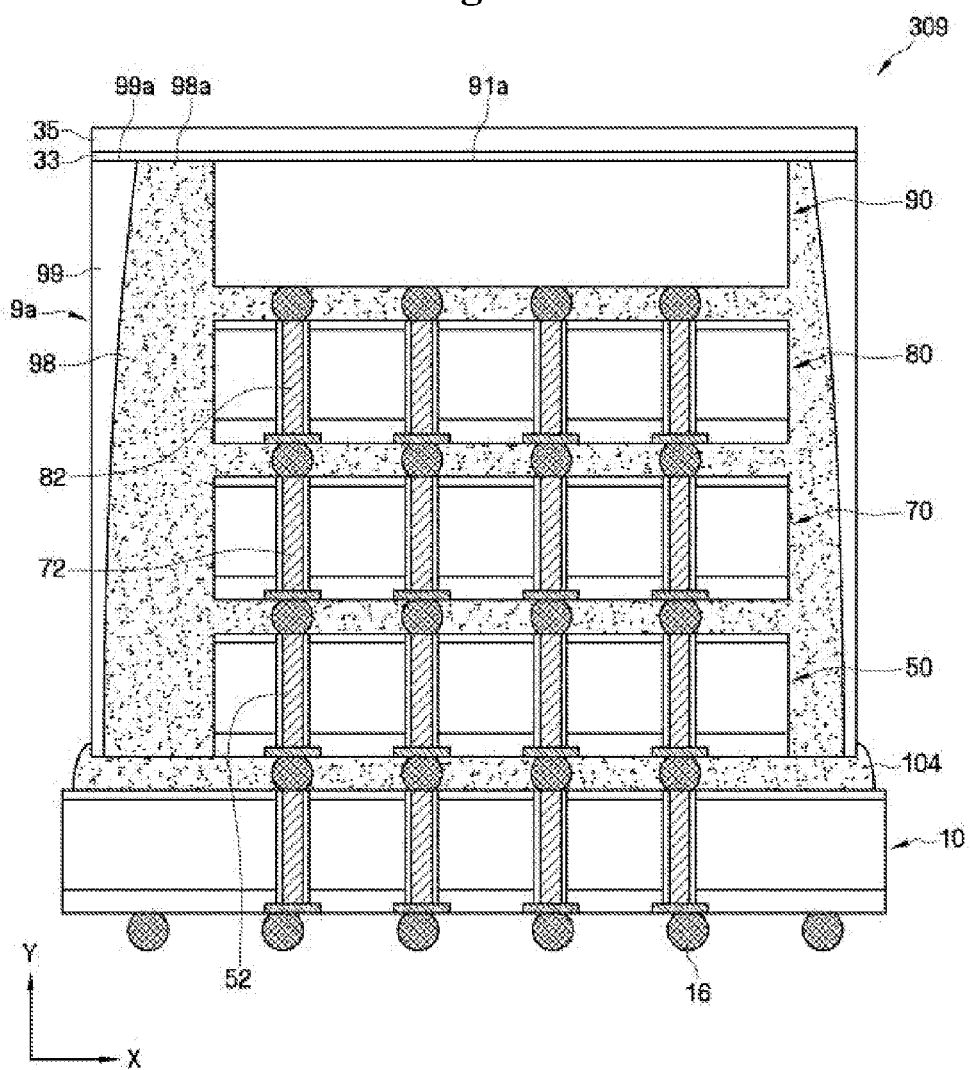
FIG. 17 is a cross-sectional view of a semiconductor device according to another exemplary embodiment.

Hereinafter, a semiconductor device according to another exemplary embodiment will be described with reference to FIG. 17. FIG. 17 is a cross-sectional view of a semiconductor device 309 according to another exemplary embodiment. Elements substantially identical to those illustrated in FIGS. 1 through 16 are indicated by like reference numerals, and thus a detailed description thereof will be omitted.

Referring to FIG. 17, an underfill portion 98 of the semiconductor device 309 surrounds sidewalls of second through fifth semiconductor chips 50, 70, 80 and 90. The underfill portion 98 may be comprised of a homogeneous integral underfill material. A filler 104 is interposed between a first semiconductor chip 10 and the second semiconductor chip 50 and fixes the stacked second through fifth semiconductor chips 50, 70, 80 and 90 onto the first semiconductor chip 10. The filler may comprise the same or a different material as the underfill material, and thus may or may not comprise a homogeneous integral underfill material with the underfill material.

Figure 18:
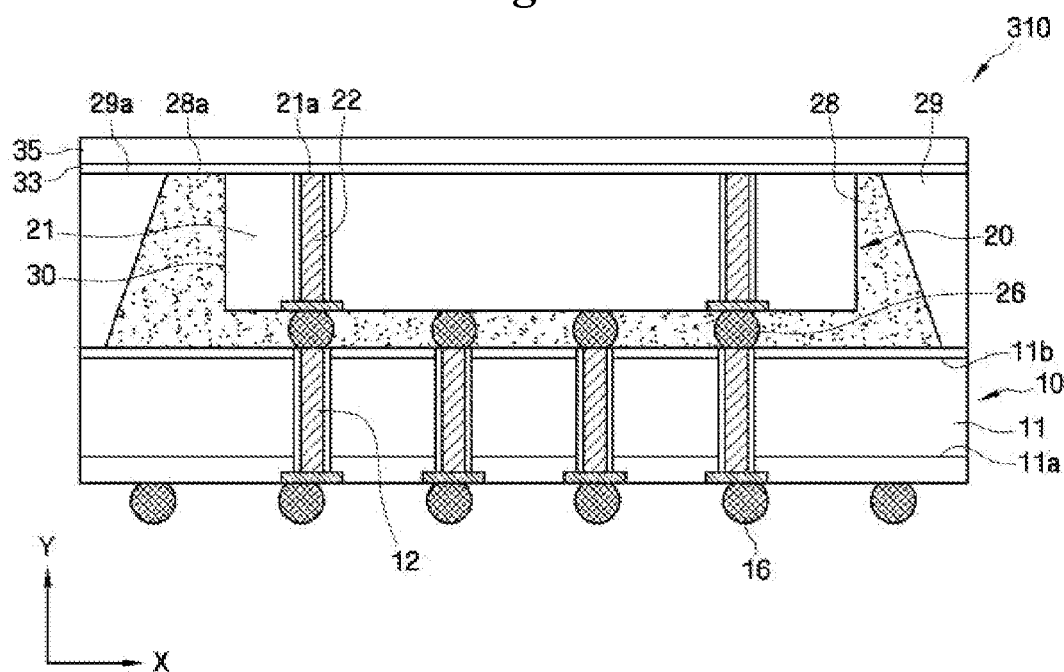
FIG. 18 is a cross-sectional view of a semiconductor device according to another exemplary embodiment.

Hereinafter, a semiconductor device according to another exemplary embodiment will be described with reference to FIG. 18. FIG. 18 is a cross-sectional view of a semiconductor device 310 according to another exemplary embodiment. Elements substantially identical to those illustrated in FIGS. 1 through 17 are indicated by like reference numerals, and thus a detailed description thereof will be omitted.

Referring to FIG. 18, in the semiconductor device 310, a second semiconductor chip 20, which is an upper chip, includes through vias 22. When a TIM 33 has electrical conductivity characteristics, if a ground voltage or a power voltage is applied to the through vias 22 formed in the second semiconductor chip 20, electro-magnetic interference (EMI) characteristics of the semiconductor device 310 can be improved.

Figure 19:
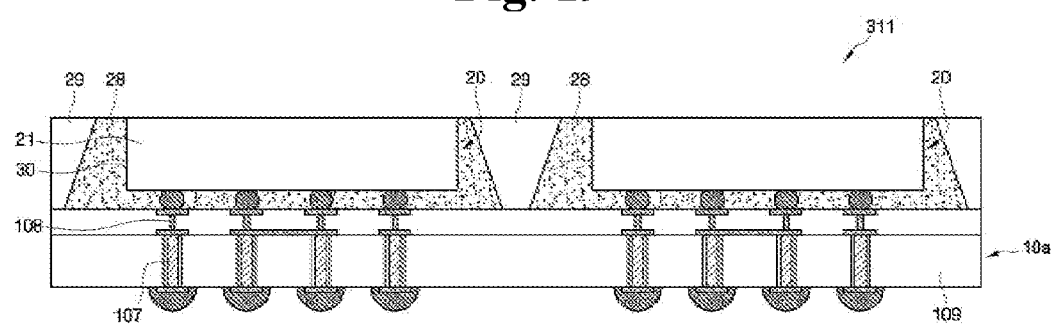
FIG. 19 is a cross-sectional view of a semiconductor device according to another exemplary embodiment.

Hereinafter, a semiconductor device according to another exemplary embodiment will be described with reference to FIG. 19. FIG. 19 is a cross-sectional view of a semiconductor device 311 according to another exemplary embodiment. Elements substantially identical to those illustrated in FIGS. 1 through 18 are indicated by like reference numerals, and thus a detailed description thereof will be omitted.

Referring to FIG. 19, in the semiconductor device 311, second semiconductor chips 20, underfill portions 28 and molding portions 29 described above with reference to FIG. 2 are formed on chip 10a. In one embodiment, chip 10a is an interposer 10a, which may comprise a substrate 109 that may be, for example, a semiconductor substrate taken from a single wafer, or a glass substrate. In one embodiment, the substrate 109 includes different die areas on which the chips 20 are mounted, each die area including an integrated circuit. In other embodiments, substrate 109 does not include any integrated circuits. Two second semiconductor chips 20 may be mounted horizontally with respect to each other on the interposer 10a (e.g. on the upper surface of a semiconductor wafer substrate). The interposer 10a may include passive elements such as a capacitor, an inductor, and a resistor, or it may not include such elements. The interposer 10a may include through vias 107. The interposer 10a may also include wiring patterns 108. The interposer 10a may electrically and physically connect to the semiconductor chips 20 through conductive elements such as solder balls, or may directly connect to the semiconductor chips 20 through, for example, through vias of the semiconductor chips 20. The semiconductor chips 20, underfill portions 28, and molding portions 29 may be formed while the semiconductor chips 20 are both on the substrate 109, and the backsides of the semiconductor chips 20 may be etched, for example, simultaneously, while the chips remain mounted to the substrate 109. After the etching, the substrate 109 can be singulated to form a plurality of combinations of semiconductor chip and substrate parts.

In the above method, the etching can be performed by one or more processes, such as, for example chemical mechanical polishing, and/or grinding that thins the semiconductor chips 20. Furthermore, after singulating the substrate, a combination of semiconductor chip and substrate parts can be mounted on another chip, or on a semiconductor package substrate.

Figure 20:
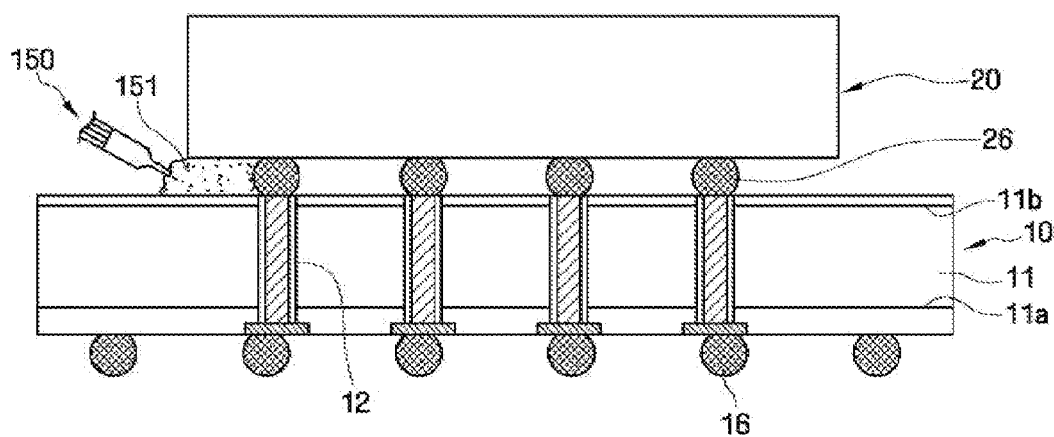
FIGS. 20 and 21 are cross-sectional views illustrating a method of fabricating a semiconductor device according to an exemplary embodiment.
Figure 21:
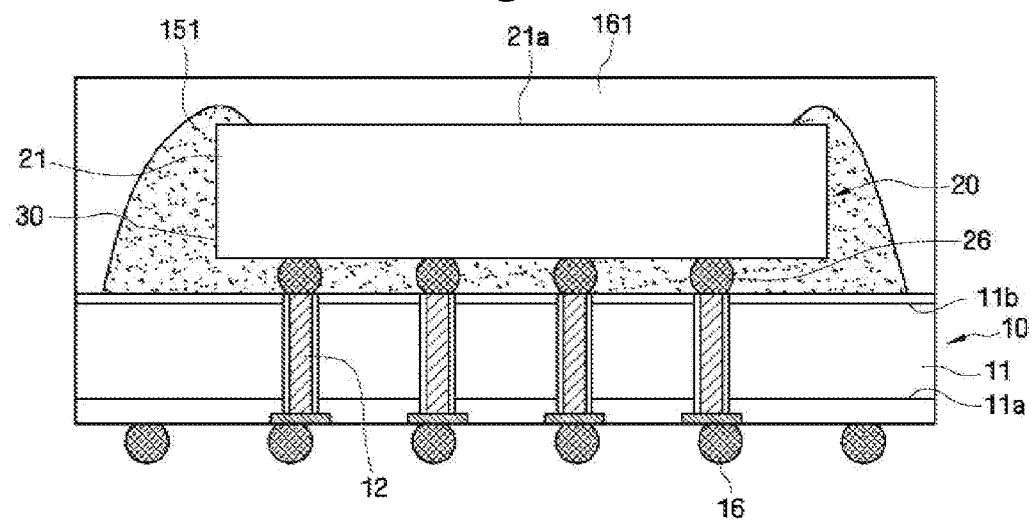

Hereinafter, a method of fabricating a semiconductor device according to an exemplary embodiment will be described with reference to FIGS. 20, 21 and 2 through 8. FIGS. 20 and 21 are cross-sectional views illustrating a method of fabricating a semiconductor device according to an exemplary embodiment. Elements substantially identical to those illustrated in FIG. 2 are indicated by like reference numerals, and thus a detailed description thereof will be omitted.

Referring to FIG. 20, a second semiconductor chip 20 is flip-chip bonded onto a first semiconductor chip 10. Then, a dispenser 150 is placed on a side of the second semiconductor chip 20, and a liquid underfill material 151 is injected from the dispenser 150 into a space between the first semiconductor chip 10 and the second semiconductor chip 20.

Referring to FIG. 21, the underfill material 151 may be formed to cover at least part of an upper surface 21a of the second semiconductor chip 20. After the underfill material 151 hardens, the second semiconductor chip 20 may be molded using a molding material 161. The molding material 161 may be formed to cover the entire upper surface 21a of the second semiconductor chip 20.

Referring to FIG. 21, the molding material 161 and the underfill material 151 formed on the upper surface 21a of the second semiconductor chip 20 may then be ground using a lapping process, thereby exposing the entire upper surface 21a of a second semiconductor substrate 21 of the second semiconductor chip 20. As a result, the upper surface 21a of the second semiconductor substrate 21 may partially be ground. In the lapping process, an underfill portion 28 is also exposed from a molding portion 29. Thus, the underfill portion 28 is interposed between sidewalls of the second semiconductor substrate 21 and the molding portion 29. As a result of the grinding process, second semiconductor chip 20 may be made thinner. In addition, the first chip may also be made thin. For example, for the different embodiments described herein, if the first chip is a same kind as the second chip, the thickness of the first chip 10 may be 50 μm or less, and the thickness of the second chip 20 may also be 50 μm or less. As a result, in one embodiment, the thickness between a bottom surface of the first chip 10 and a top surface of the second chip 20 may be 120 μm or less. In addition, if the first chip a different kind as the second chip, for example, the first chip is a logic chip and the second chip is a memory chip, the thickness of the first chip 10 may be 50 μm or more, and the thickness of the second chip 20 may be 50 μm or less. This structure can prevent the first chip 10 from mechanical damage caused by stacking of second chip 20. For example, if a plurality of memory chips are stacked on the first chip 10, the first chip 10 needs more mechanical strength, so that the thickness of the first chip 10 is over 50 μm. Although 50 μm is given as an example, other thicknesses may be used. However, in one embodiment, 50 μm serves as an exemplary threshold thickness for the first chip 10, wherein if the chip is made to be less than the threshold thickness, significant wafer warpage may occur, but if the chip is made to be equal to or greater than the threshold thickness, wafer warpage is minimized.

Referring to FIG. 8, a TIM 33 may then be coated on the upper surface 21a of the second semiconductor substrate 21, an upper surface 28a of the underfill portion 28 and an upper surface 29a of the molding portion 29, and a heat sink 35 may be attached onto the TIM 33.

Hereinafter, a method of fabricating a semiconductor device according o another exemplary embodiment will be described with reference to FIGS. 22 through 27 and 15. FIGS. 22 through 27 are cross-sectional views illustrating a method of fabricating a semiconductor device according to another exemplary embodiment. Elements substantially identical to those illustrated in FIG. 15 are indicated by like reference numerals, and thus a detailed description thereof will be omitted.

Figure 22:
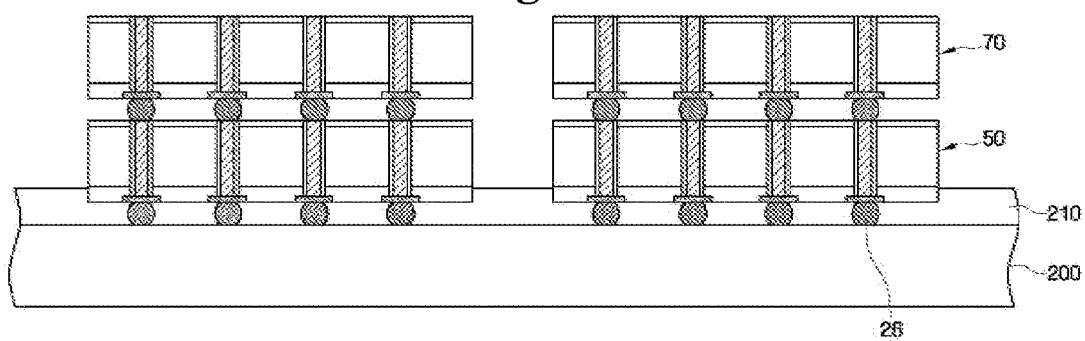
FIGS. 22 through 27 are cross-sectional views illustrating a method of fabricating a semiconductor device according to another exemplary embodiment.

Referring to FIG. 22, second semiconductor chips 50 are placed on a carrier substrate 200, and third semiconductor chips 70 are respectively flip-chip bonded onto the second semiconductor chips 50. In one embodiment, a blocking film 210 concealing second conductive members 26 may be formed to prevent an underfill material from filling the space between the second semiconductor chips 50 and the carrier substrate 200.

Figure 23:
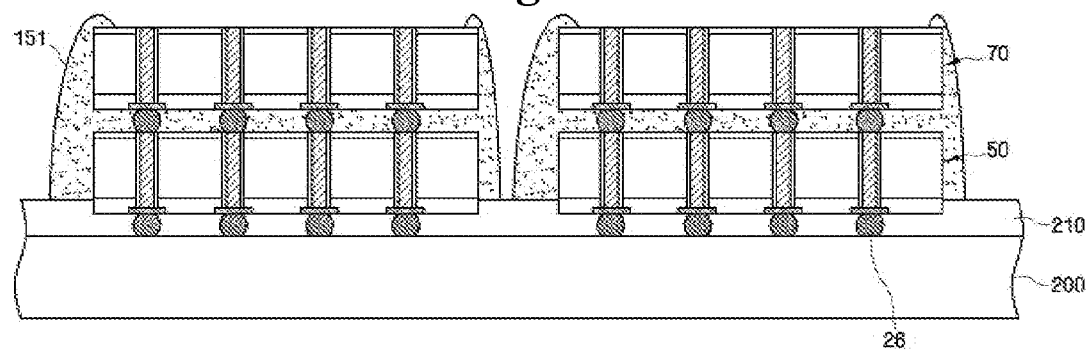

Referring to FIG. 23, a dispenser 150 (see FIG. 20) is placed on the blocking film 210, and a liquid underfill material 151 is injected from the dispenser 150. The underfill material 151 fills the space between the second semiconductor chips 50 and the third semiconductor chips 70 and in one embodiment covers the entire sidewalls of the second and third semiconductor chips 50 and 70 and at least part of an upper surface of each of the third semiconductor chips 70.

Figure 24:
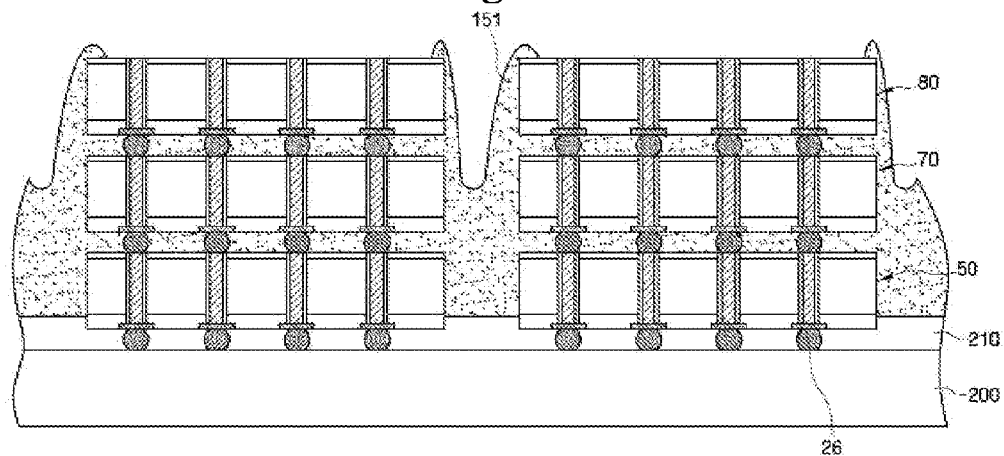

Referring to FIG. 24, fourth semiconductor chips 80 are respectively flip-chip bonded onto the third semiconductor chips 70, and the underfill material 151 is injected to fill the space between the third semiconductor chips 70 and the fourth semiconductor chips 80 and cover the entire sidewalls of each of the fourth semiconductor chips 80 and at least part of an upper surface of each of the fourth semiconductor chips 80. The underfill material 151 for each stack of chips may be connected to the underfill material 151 for a neighboring stack of chips.

Figure 25:
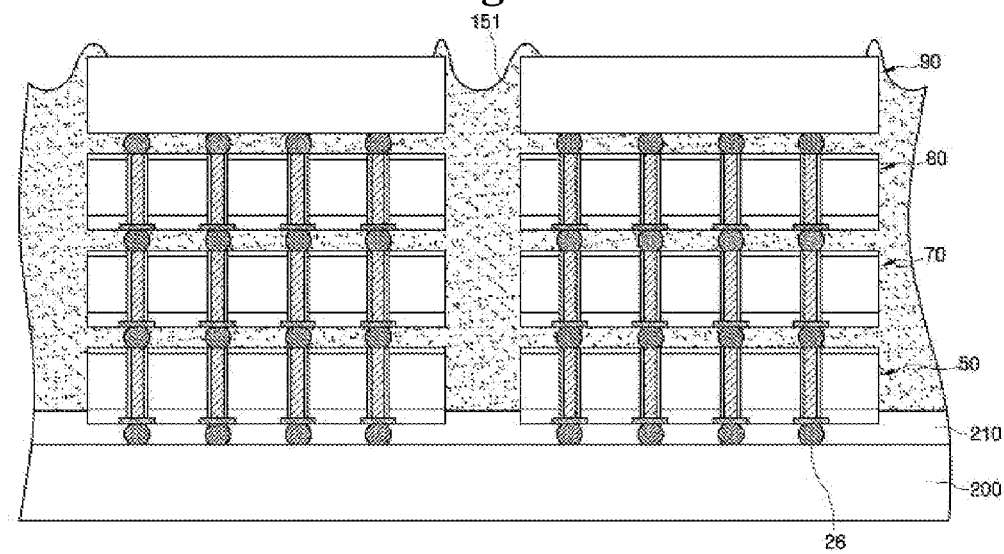

Referring to FIG. 25, fifth semiconductor chips 90 are respectively flip-chip bonded onto the fourth semiconductor chips 80, and the underfill material 151 is injected to fill the space between the fourth semiconductor chips 80 and the fifth semiconductor chips 90 and cover the entire sidewalls of each of the fifth semiconductor chips 90 and at least part of an upper surface of each of the fifth semiconductor chips 90. In one embodiment, the underfill material 151 remains a liquid material during the process of stacking the chips until all of the chips of the stack are stacked. After that point, the underfill material may be allowed to harden to form a solid homogeneous integral underfill material.

Figure 26:
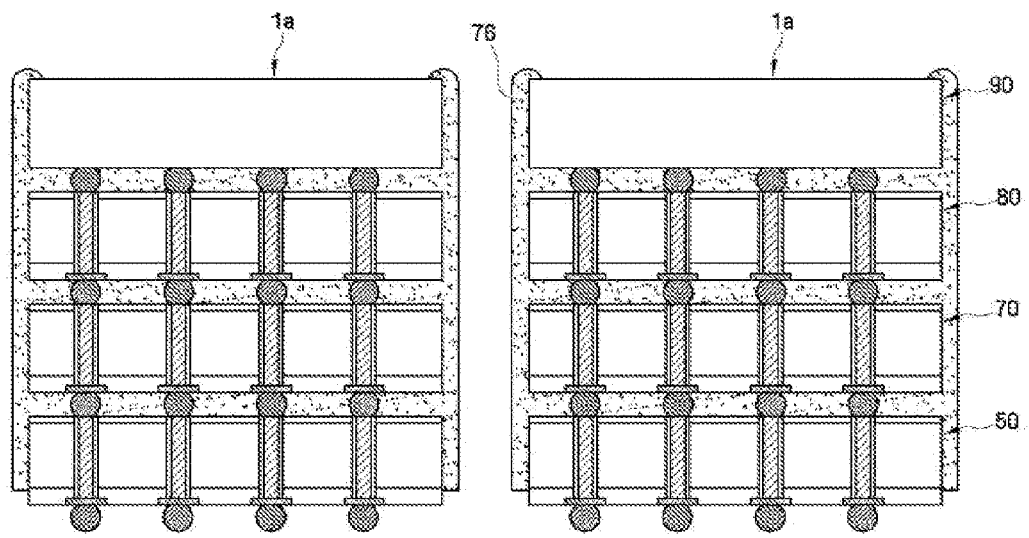

Referring to FIGS. 25 and 26, the carrier substrate 200 and the blocking film 210 are separated from the second semiconductor chips 50. Then, the resultant structure is cut into individual stacked chip structures 1a. Each of the stacked chip structures 1a may include a first sub-underfill portion 76 which fills in the spaces between the second through fifth semiconductor chips 50, 70, 80 and 90, and surrounds the sidewalls of the second through fifth semiconductor chips 50, 70, 80 and 90.

Figure 27:
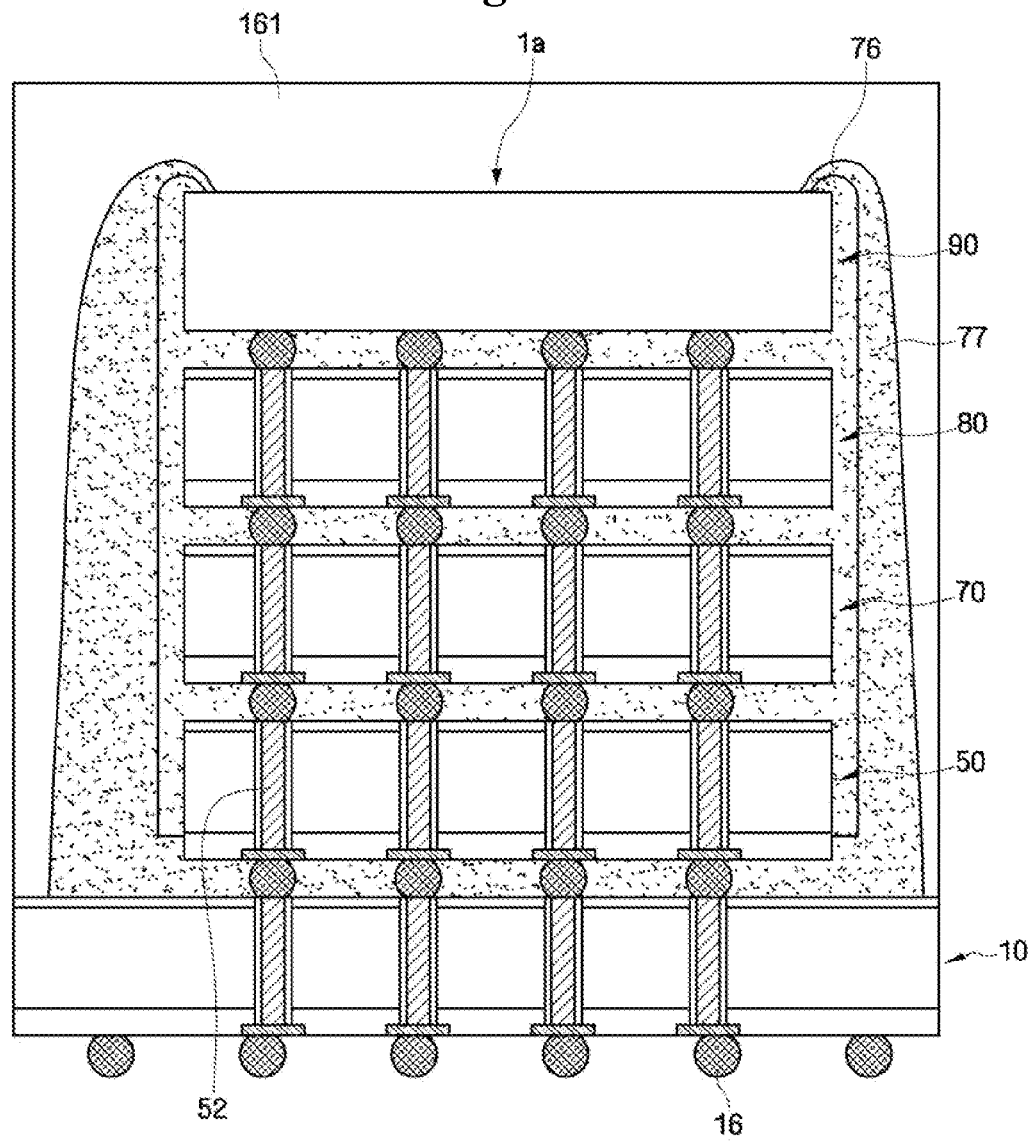

Referring to FIG. 27, each of the stacked chip structures 1a is flip-chip bonded onto a first chip 10, which may be a semiconductor chip, and for each stacked chip structure 1a, the underfill material 151 is injected to form a second sub-underfill portion 77, which fills the space between the first chip 10 and the second semiconductor chip 50 and cover the first sub-underfill portion 76 and at least part of the upper surface of the fifth semiconductor chip 90. Then, each of the stacked chip structures 1a may be molded using a molding material 161. The molding material 161 may be formed to cover the entire upper surface of each of the fifth semiconductor chips 90.

Referring to FIG. 15, the entire upper surface 91a of a semiconductor substrate of each of the fifth semiconductor chips 90 may be exposed by a lapping process. In the lapping process, an underfill portion 78 is also exposed from a molding portion 79. Thus, the underfill portion 78 is interposed between the sidewalls of the second through fifth semiconductor chips 50, 70, 80 and 90 and the molding portion 79. Next, a TIM 33 may be coated on the upper surface 91a of the semiconductor substrate of each of the fifth semiconductor chips 90, an upper surface 78a of the underfill portion 78 and an upper surface 79a of the molding portion 79, and a heat sink 35 may be attached onto the TIM 33.

Figure 28:
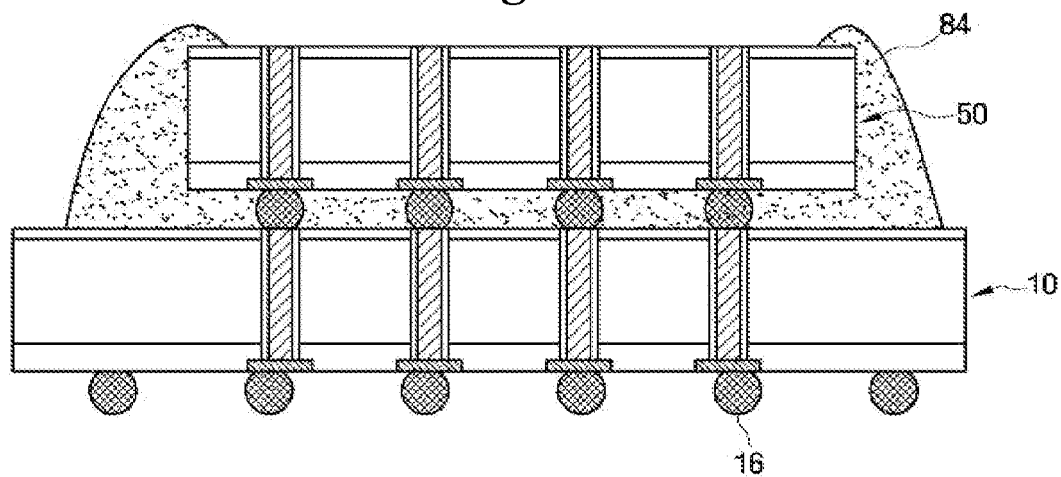
FIGS. 28 through 30 are cross-sectional views illustrating a method of fabricating a semiconductor device according to another exemplary embodiment.
Figure 29:
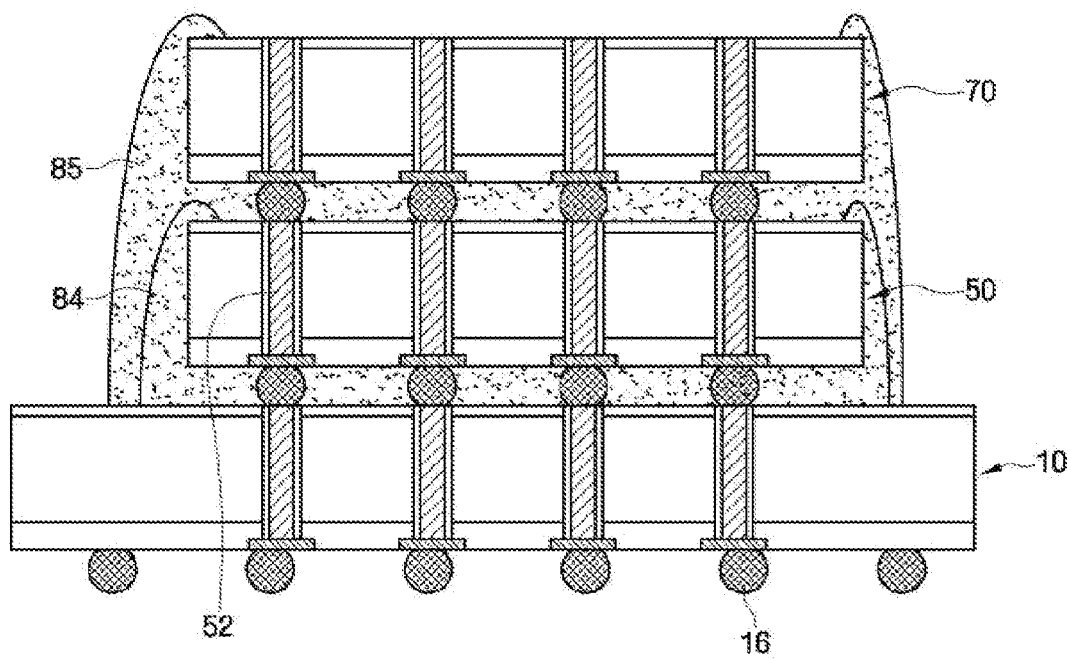
Figure 30:
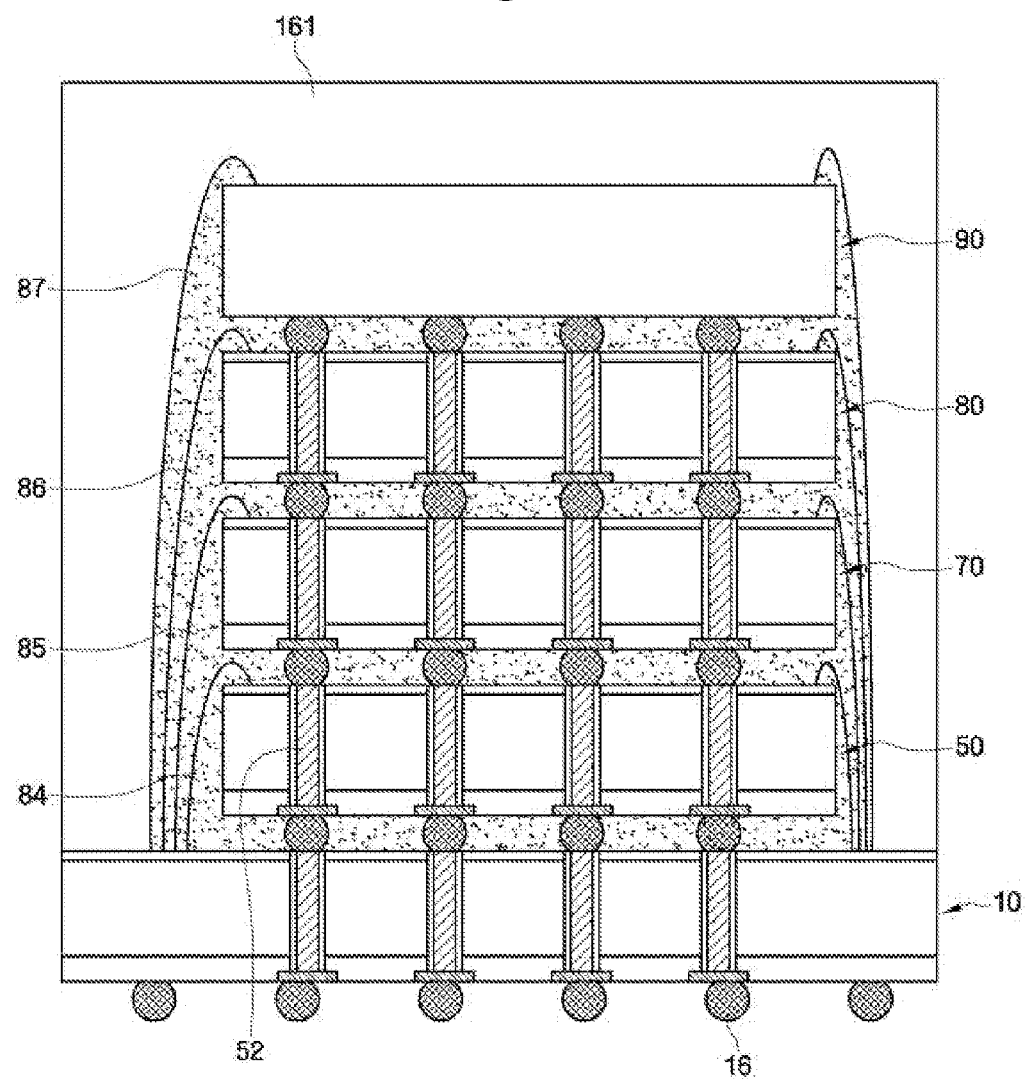

Hereinafter, a method of fabricating a semiconductor device according to another exemplary embodiment will be described with reference to FIGS. 28 through 30 and 16. FIGS. 28 through 30 are cross-sectional views illustrating a method of fabricating a semiconductor device according to another exemplary embodiment. Elements substantially identical to those illustrated in FIG. 16 are indicated by like reference numerals, and thus a detailed description thereof will be omitted.

Referring to FIG. 28, a second semiconductor chip 50 is flip-chip bonded onto a first semiconductor chip 10, and an underfill material is injected to form a first sub-underfill portion 84. The first sub-underfill portion 84 may be formed to fill the space between the first semiconductor chip 10 and the second semiconductor chip 50 and cover the entire sidewalls of the second semiconductor chip 50 and at least part of an upper surface of the second semiconductor chip 50.

Referring to FIG. 29, a third semiconductor chip 70 is flip-chip bonded onto the second semiconductor chip 50, and the underfill material is injected to form a second sub-underfill portion 85. The second sub-underfill portion 85 may be formed to fill the space between the second semiconductor chip 50 and the third semiconductor chip 70 and cover the entire sidewalls of the third semiconductor chip 70 and at least part of an upper surface of the third semiconductor chip 70.

Referring to FIG. 30, a fourth semiconductor chip 80 is flip-chip bonded onto the third semiconductor chip 70, and the underfill material is injected to form a third sub-underfill portion 86. The third sub-underfill portion 86 may be formed to fill the space between the third semiconductor chip 70 and the fourth semiconductor chip 80 and cover the entire sidewalls of the fourth semiconductor chip 80 and at least part of an upper surface of the fourth semiconductor chip 80.

Then, a fifth semiconductor chip 90 is flip-chip bonded onto the fourth semiconductor chip 80, and the underfill material is injected to form a fourth sub-underfill portion 87. The fourth sub-underfill portion 87 may be formed to fill the space between the fourth semiconductor chip 80 and the fifth semiconductor chip 90 and cover the entire sidewalls of the fifth semiconductor chip 90 and at least part of an upper surface of the fifth semiconductor chip 90. In one embodiment, the first through fourth sub-underfill portions may comprise the same material, and thus may form a structure comprised of a homogeneous integral underfill material.

Next, the stacked second through fifth semiconductor chips 50, 70, 80 and 90 may be molded using a molding material 161. The molding material 161 may be formed to cover the entire upper surface of the fifth semiconductor chip 90.

Referring to FIG. 16, the entire upper surface 91a of a semiconductor substrate of the fifth semiconductor chip 90 may be exposed by a lapping process. In the lapping process, an underfill portion 88 is also exposed from a molding portion 89. Thus, the underfill portion 88 is interposed between the sidewalls of the second through fifth semiconductor chips 50, 70, 80 and 90 and the molding portion 89. Next, a TIM 33 may be coated on the upper surface 91a of the semiconductor substrate of the fifth semiconductor chip 90, an upper surface 88a of the underfill portion 88 and an upper surface 89a of the molding portion 89, and a heat sink 35 may be attached onto the TIM 33.

Figure 31:
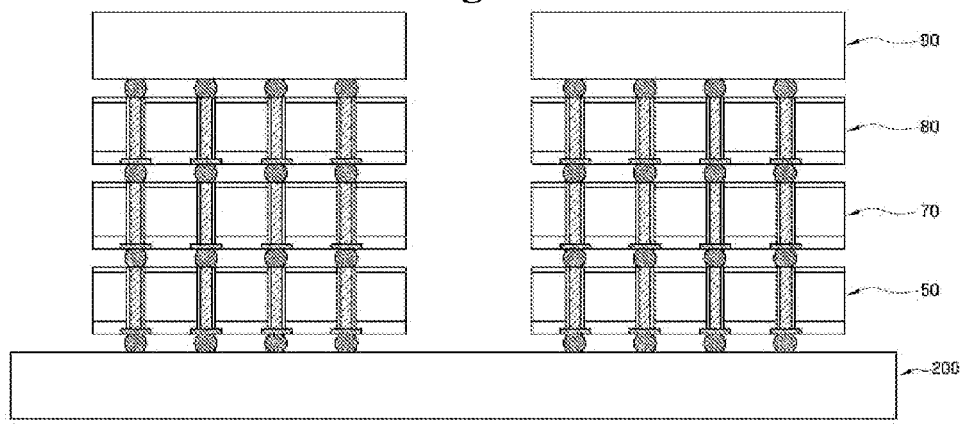
FIGS. 31 through 33 are cross-sectional views illustrating a method of fabricating a semiconductor device according to another exemplary embodiment.
Figure 32:
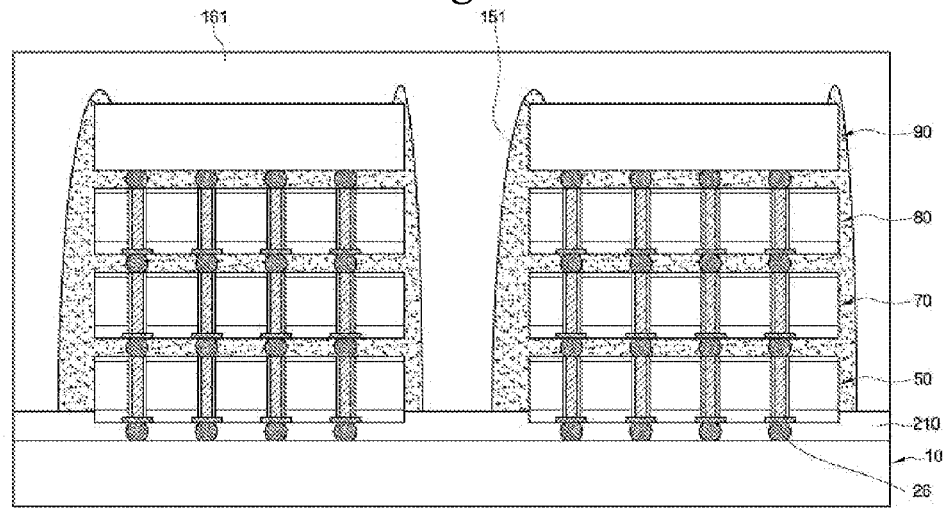
Figure 33:
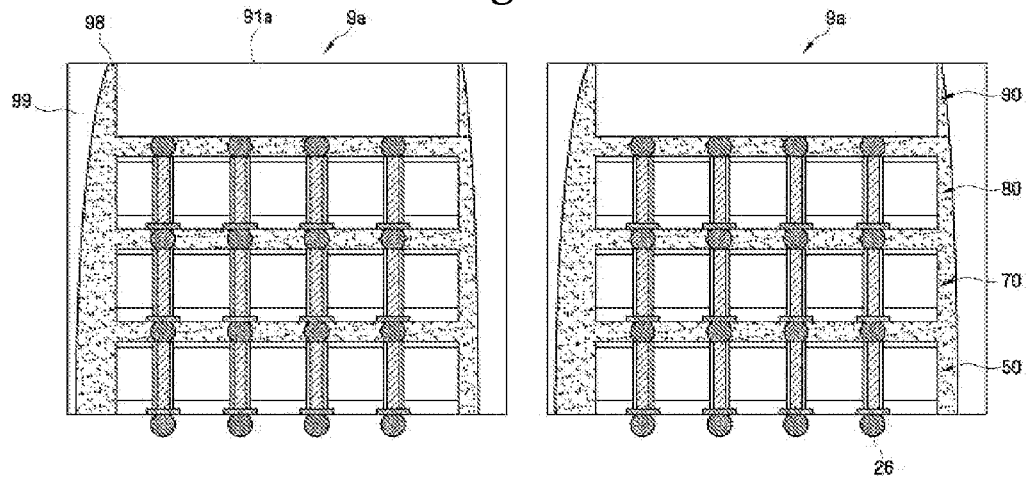

Hereinafter, a method of fabricating a semiconductor device according to another exemplary embodiment will be described with reference to FIGS. 31 through 33 and 17. FIGS. 31 through 33 are cross-sectional views illustrating a method of fabricating a semiconductor device according to another exemplary embodiment. Elements substantially identical to those illustrated in FIG. 17 are indicated by like reference numerals, and thus a detailed description thereof will be omitted.

Referring to FIG. 31, second through fifth semiconductor chips 50, 70, 80 and 90 are sequentially flip-chip bonded onto a carrier substrate 200.

Referring to FIG. 32, a blocking film 210 concealing second conductive members 26 may be formed to prevent an underfill material from filling the space between the second semiconductor chips 50 and the carrier substrate 200. An underfill material 151 is then injected onto the blocking film 210. The underfill material 151 may be formed to fill the space between the second through fifth semiconductor chips 50, 70, 80 and 90 and cover sidewalls of the second through fifth semiconductor chips 50, 70, 80 and 90 and at least part of an upper surface of each of the fifth semiconductor chips 90. The underfill material may be inserted as a liquid, which then hardens to form a solid, homogeneous integral underfill material.

Next, the stacked second through fifth semiconductor chips 50, 70, 80 and 90 may be molded using a molding material 161. The molding material 161 may be formed to cover the entire upper surface of each of the fifth semiconductor chips 90.

Referring to FIG. 33, the entire upper surface 91a of a semiconductor substrate of each of the fifth semiconductor chips 90 may be exposed by a lapping process. In the lapping process, an underfill portion 98 is also exposed from a molding portion 99. Thus, the underfill portion 98 is interposed between the sidewalls of the second through fifth semiconductor chips 50, 70, 80 and 90 and the molding portion 99.

Next, the carrier substrate 200 and the blocking film 210 are separated from the second semiconductor chips 50. Then, the resultant structure is cut into individual stacked chip structures 9a. Each of the stacked chip structures 9a may include the underfill portion 98 which surrounds the sidewalls of the second through fifth semiconductor chips 50, 70, 80 and 90 and the molding portion 99 which surrounds the underfill portion 98.

Referring to FIG. 17, each of the stacked chip structures 9*a* is flip-chip bonded onto a first semiconductor chip 10, and a filler 104 is injected into the space between each of the second semiconductor chips 50 and the first semiconductor chip 10, thereby fixing each of the stacked chip structures 9*a* onto the first semiconductor chip 10.

Next, a TIM 33 may be coated on the upper surface 91*a* of the semiconductor substrate of each of the fifth semiconductor chips 90, an upper surface 98*a* of the underfill portion 98 and an upper surface 99*a* of the molding portion 99, and a heat sink 35 may be attached onto the TIM 33.

Figure 34:
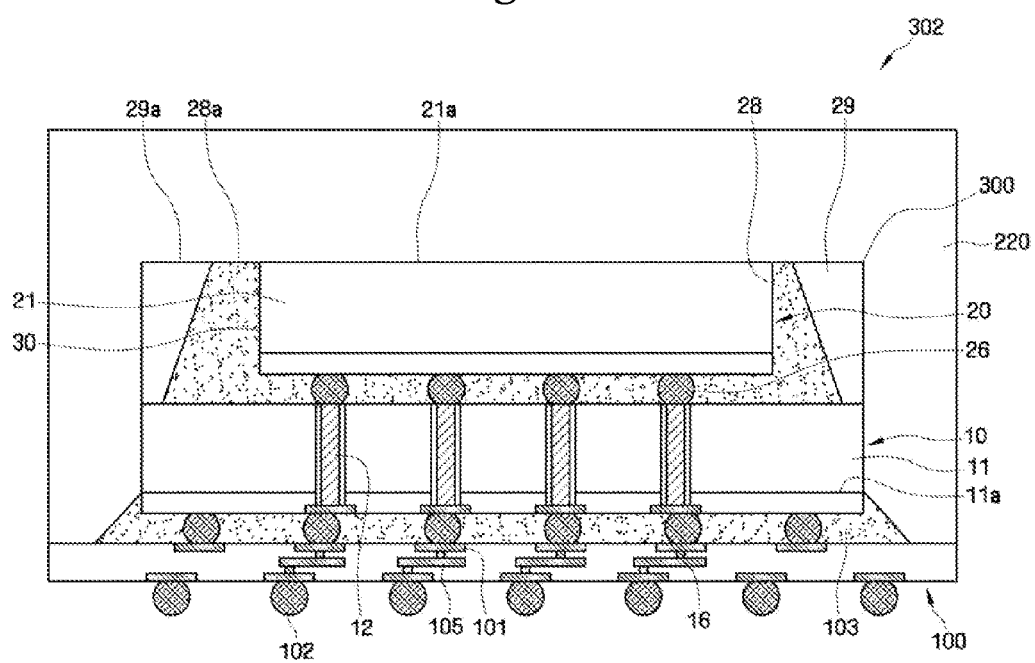
FIG. 34 is a cross-sectional view of a semiconductor device according to another exemplary embodiment.

Hereinafter, a semiconductor device according to another exemplary embodiment will be described with reference to FIG. 34. FIG. 34 is a cross-sectional view of a semiconductor device 302 according to another exemplary embodiment. Elements substantially identical to those illustrated in FIGS. 1 through 8 are indicated by like reference numerals, and thus a detailed description thereof will be omitted.

Referring to FIG. 34, in the semiconductor device 302, the semiconductor device 300 shown, for example, in FIG. 2 is mounted on a package substrate 100. The semiconductor device 300 may include wafer-level molding, and may include, for example, a first underfill portion 28 and a molding portion 29 surrounding outer sidewalls of the first underfill portion 28. As described above in connection with FIG. 2, a top surface of the semiconductor device 300 could be planarized using a grinding process. In one embodiment, after semiconductor device 300 is formed, it is mounted on the package substrate 100.

The package substrate 100 may include circuit patterns 105 connected to a first chip 10 and a second chip 20. The first chip 10 and the second chip 20 may be electrically connected to a device outside the semiconductor device 302 by the circuit patterns 105. The package substrate 100 may be, for example, a PCB or a film substrate having the circuit patterns 105. The package substrate 100 may include bonding pads 101 to which first conductive members 16 can be connected, respectively.

The package substrate 100 may further include conductive members 102 used to connect the semiconductor device 302 to an external device. For example, the semiconductor device 302 may be mounted on a set board (not shown) by the conductive members 102. In another example, the package substrate 100 may be a system board.

A filler 103 may then be interposed between the package substrate 100 and the first chip 10 to form a second underfill portion. The filler 103 may fix the first chip 10 to the package substrate 100. The filler 103 may contain an underfill material, such as a homogeneous integral underfill material as described above.

The overmold 220 may then be formed to surround semiconductor device 300. In one embodiment, an overmold 220 may extend from an upper surface of the package substrate 100 to surround the filler 103 and semiconductor device 300, including the side surfaces and a top surface of the semiconductor device 300. As such, the overmold 220 may contact side surfaces of second underfill portion, outer side surfaces and top surfaces of the molding portion 29, top surfaces of the first underfill portion 28, and a top surface of second chip 20. In certain embodiments, the overmold 220 may be formed of the same or different material as the molding portion 29, and may have the same or a larger CTE than the molding portion 29.

Figure 35:
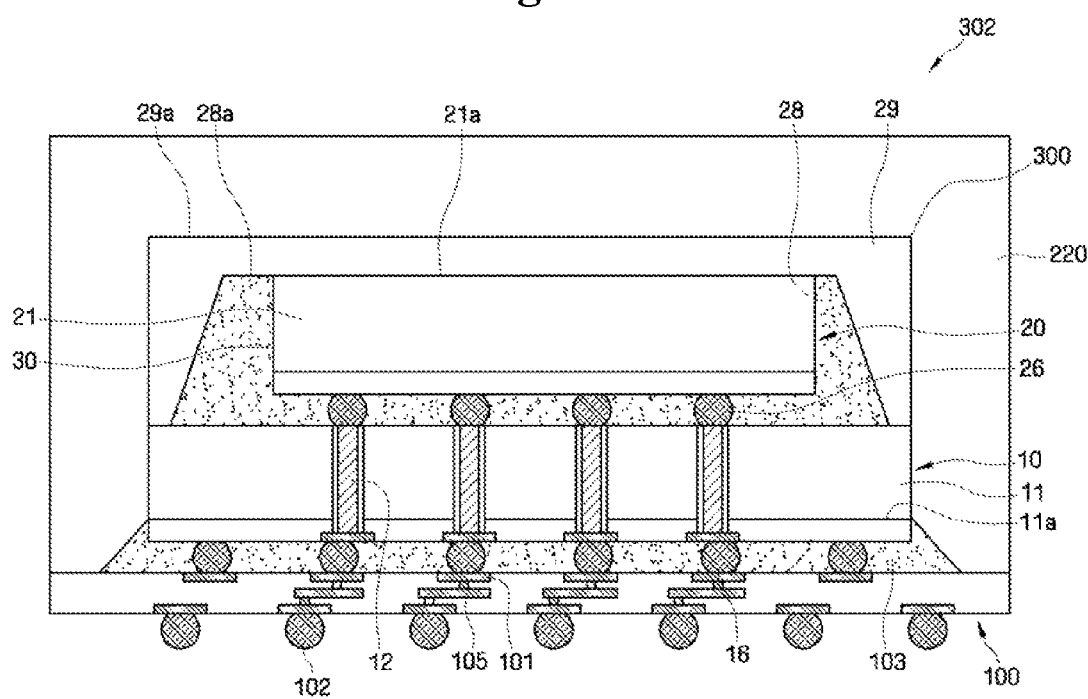
FIG. 35 a cross-sectional view of a semiconductor device according to another exemplary embodiment.

Hereinafter, a semiconductor device according to another exemplary embodiment will be described with reference to FIG. 35. FIG. 35 is a cross-sectional view of a semiconductor device 302 according to another exemplary embodiment. FIG. 35 shows an embodiment similar to FIG. 34, except that in FIG. 35, a top of the semiconductor device 300 (i.e., second chip 20, first underfill portion 28, and molding portion 29) are not subject together to a grinding process and therefore do not include coplanar top surfaces. Instead, second chip 20 may be ground for thinning prior to forming first underfill portion 28. Subsequently, the first underfill portion 28 may be formed to surround the sidewalls of second chip 20 and to extend above part of the top surface of second chip 20. Molding portion 29 may then be formed to cover and surround sidewalls and a top portion of the first underfill portion 28 and also to cover a top surface of second chip 20. The semiconductor device 300 is then stacked on a package substrate, and a second underfill portion (filler 103) is formed. Finally, in this embodiment, overmold 220 is formed, and extends from an upper surface of the package substrate 100 to surround the filler 103 and semiconductor device 300, including the side surfaces and a top surface of the semiconductor device. In one embodiment, the overmold 220 does not contact the first underfill portion 28 or second chip 20.

Figure 36:
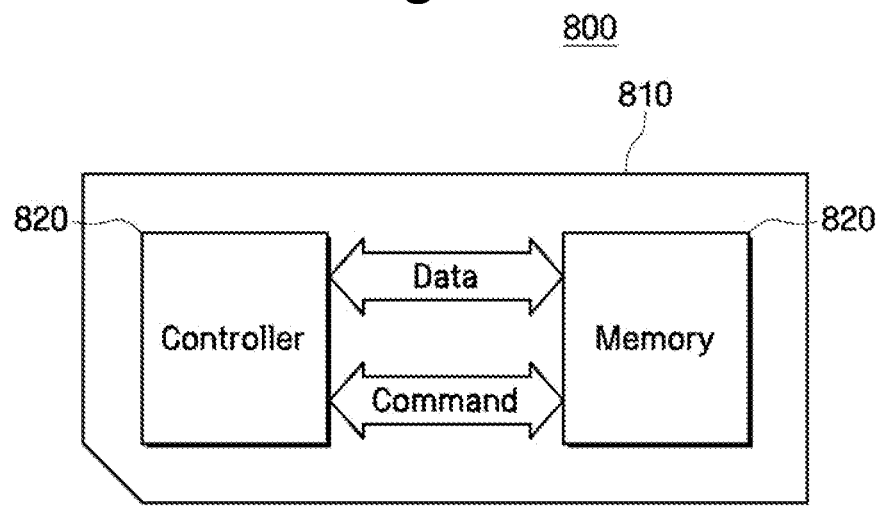
FIG. 36 is a schematic diagram of a memory card using a semiconductor device according to an exemplary embodiment.

FIG. 36 is a schematic diagram of a memory card 800 using a semiconductor device according to an exemplary embodiment. Referring to FIG. 36, the memory card 800 may include a controller 820 and a memory 830 in a housing 810. The controller 820 and the memory 830 may exchange electrical signals with each other. For example, the controller 820 and the memory 830 may exchange data with each other in response to a command from the controller 820. Accordingly, the memory card 800 may store data in the memory 830 or output the data from the memory 830 to an external destination.

The controller 820 or the memory 830 may include at least one of the semiconductor devices according to the exemplary embodiments described above. For example, the controller 820 may include a system-in package, and the memory 830 may include a multichip package. Alternatively, the controller 820 and/or the memory 830 may be provided as a stacked package. The memory card 800 may be used as a data storage medium of various portable devices. For example, the memory card 800 may be a multimedia card (MMC) or a secure digital (SD) card.

Figure 37:
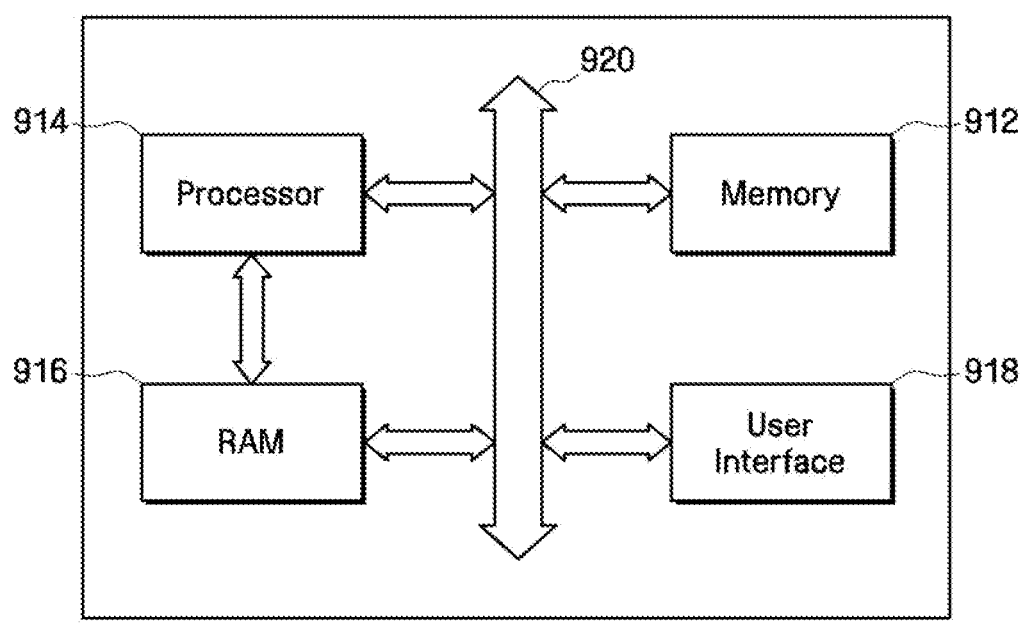
FIG. 37 is a block diagram of an electronic system using a semiconductor device according to an exemplary embodiment.

FIG. 37 is a block diagram of an electronic system 900 using a semiconductor device according to an exemplary embodiment. Referring to FIG. 37, the electronic system 900 may include at least one of the semiconductor devices according to the exemplary embodiments described above. Examples of the electronic system 900 include a mobile device, such as a PDA, cell phone, camera, media player, laptop computer, etc., or a computer, such as a desktop computer. The electronic system 900 may include a memory system 912, a processor 914, a RAM 916, and a user interface 918. These elements may exchange data with each other by using a bus 920. The processor 914 may execute a program and control the electronic system 900. The RAM 916 may be used as a dynamic memory of the processor 914. Each of the processor 914 and the RAM 916 may include one of the semiconductor devices according to the exemplary embodiments described above. Alternatively, the processor 914 and the RAM 916 may be included in one package. The user interface 918 may be used to input or output data to/from the electronic system 900. The memory system 912 may store codes needed to operate the processor 914 and data processed by the processor 914 or data input from an external source.

The memory system 912 may include a controller and a memory and may be configured in substantially the same manner as the memory card 800 of FIG. 36.

Figure 38:
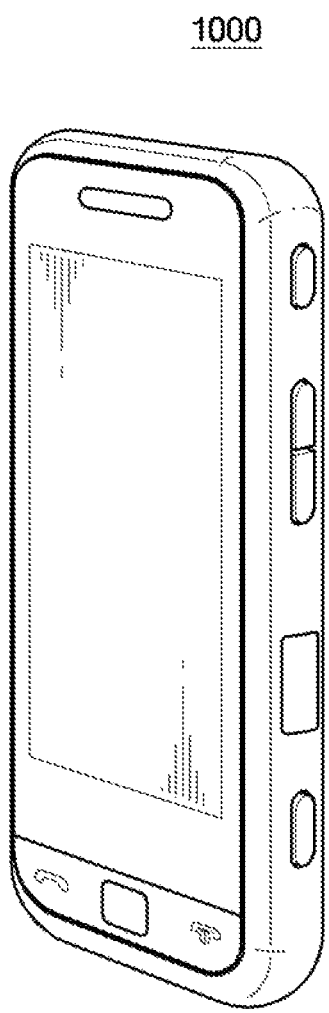
FIG. 38 is a diagram illustrating an exemplary case where the electronic system of FIG. 37 is used in a mobile phone.

The electronic system 900 can be used in an electronic controller of various electronic devices. FIG. 38 is a diagram illustrating a case where the electronic system 900 (see FIG. 37) is used in a mobile phone 1000. The electronic system 900 (see FIG. 37) can also be used in portable notebooks, MP3 players, navigation devices, solid-state disks (SSDs), vehicles, household appliances, or other electronic devices.

While the present disclosure has been particularly shown and described with reference to exemplary embodiments thereof, it will be understood by those of ordinary skill in the art that various changes in form and detail may be made therein without departing from the spirit and scope of the following claims. The exemplary embodiments should be considered in a descriptive sense only and not for purposes of limitation.

What is claimed is:

1. A stack of semiconductor chips comprising:
    a first chip of the stack;
    a second chip of the stack over the first chip;
    conductive bumps extending between an upper surface of the first chip and a lower surface of the second chip;
    a homogeneous integral underfill material interposed between the first chip and the second chip, encapsulating the conductive bumps, and extending along sidewalls of the second chip, the homogeneous integral underfill material having an upper surface extending away from the sidewalls of the second chip, the upper surface of the homogeneous integral underfill material having a height with respect to the upper surface of the first chip corresponding to a height of an upper surface of the second chip with respect to the upper surface of the first chip, the homogeneous integral underfill material not covering the upper surface of the second chip; and
    a molding material on outer side surfaces of the homogeneous integral underfill material above the upper surface of the first chip, wherein, in view of a first cross sectional profile, the molding material is separated from sidewalls of the second chip by the homogeneous integral underfill material such that the molding material does not contact sidewalls of the second chip.

2. The stack of claim 1, wherein the homogeneous integral underfill material comprises a combination of silica and resin.

3. The stack of claim 1, wherein the molding material completely surrounds all sides of the second chip.

4. The stack of claim 1, wherein the first chip comprises an integrated circuit and a plurality of through vias.

5. The stack of claim 4, wherein the second chip is electrically connected to some of the through vias.

6. The stack of claim 5, wherein some of the through vias electrically connected to the second chip are isolated from the integrated circuit of the first chip.

7. The stack of 6, wherein others of the through vias are electrically connected to the integrated circuit of the first chip.

8. The stack of claim 1, wherein the second chip is the topmost chip of the stack of semiconductor chips.

9. The semiconductor package of claim 1, wherein the upper surface of the underfill material is planar.

10. The semiconductor package of claim 1, wherein the upper surface of the underfill material has a cross sectional profile that is concave or convex.

11. The stack of claim 1, wherein an upper surface of the molding material, the upper surface of the homogeneous integral underfill material and the upper surface of the second chip are co-planar.

12. The stack of claim 1, wherein the entire upper surface of the molding material, the entire upper surface of the homogeneous integral underfill material and the entire upper surface of the second chip each lie within 5 um of a first plane.

13. The stack of claim 1, wherein the homogeneous integral underfill material extends above sidewalls of the second chip and contacts the upper surface of the second chip at locations adjacent the sidewalls.

14. The stack of claim 1, wherein the molding material extends over the upper surface of the second chip and contacts a center portion of the upper surface of the second chip.

15. The stack of claim 1, wherein the thickness of the first chip is 50 um or more and the thickness of the second chip is 50 um or less.

16. The stack of claim 1, wherein the coefficient of thermal expansion (CTE) of the stack is less than 6 ppm/K.

17. The stack of claim 16, wherein the CTE of the chip stack is less than 4 ppm/K.

18. The stack of claim 1, wherein a ratio of the CTE of the homogeneous integral underfill material to the CTE of the second chip is less than ⅓.

19. The stack of claim 1, wherein a CTE of the homogeneous integral underfill material is larger than a CTE of the first chip and smaller than a CTE of the molding material.

20. The stack of claim 1, wherein a ratio of the volume of molding material to the volume of the homogeneous integral underfill material is equal to or less than 2.

21. The stack of claim 1, wherein, with respect to a vertical cross sectional profile of the combination of the first chip, the second chip and the homogeneous integral underfill:
    the homogeneous integral underfill material extends along the upper surface of the first chip a first distance from a first location directly under a first sidewall of the second chip to a second location at an edge of the underfill at the upper surface of the first chip that is not under the second chip, and
    the upper surface of the homogeneous integral underfill material comprises a portion extending away from the first sidewall to a side of the homogeneous integral underfill material a second distance,
    wherein a ratio of the second distance to the first distance less than or equal to 0.5.

22. The stack of claim 1, wherein a maximum thickness of the homogeneous integral underfill material in the horizontal direction from the sidewalls of the first chip is 700 μm.

23. The stack of claim 1, wherein a distance of the upper surface of the homogeneous integral underfill material in the horizontal direction from a sidewall of the second chip is different from a distance of the upper surface of the homogeneous integral underfill material in the horizontal direction from another sidewall of the second chip.

24. The stack of claim 1, further comprising:
    a heat sink attached to the backside of the second chip.

25. The semiconductor device of claim 1, further comprising a package substrate disposed under the first chip.

26. The semiconductor device of claim 25, further comprising a filler covering a space between the package substrate and the first chip, sidewalls of the first chip, and part of sidewalls of the molding material.

27. The semiconductor device of claim 26, wherein a height from an upper surface of the package substrate to an upper surface of the molding portion is h, and a height from the upper surface of the package substrate to an upper surface of the filler is 0.7 h or more.

28. A stack of semiconductor chips comprising:
    a first chip and a second chip over the first chip;

conductive bumps extending between an upper surface of the first chip and a lower surface of the second chip; and a homogeneous integral underfill material interposed between the first chip and the second chip, encapsulating the conductive bumps, and extending along sidewalls of the second chip to the upper surface of the second chip, wherein the thickness of the first chip is 50 um or more and the thickness of the second chip is 50 um or less, and wherein the homogeneous integral underfill material does not cover the upper surface of the second chip.

29. A stack of semiconductor chips comprising:

a first chip and a second chip over the first chip;

conductive bumps extending between an upper surface of the first chip and a lower surface of the second chip; and a homogeneous integral underfill material interposed between the first chip and the second chip, encapsulating the conductive bumps, and extending along sidewalls of the second chip to the upper surface of the second chip, wherein the thickness from a lower surface of the first chip to the upper surface of the second chip is 120 um or less, and wherein the homogeneous integral underfill material does not cover the upper surface of the second chip.

30. A stack of semiconductor chips comprising:

a first chip and a second chip over the first chip;

conductive bumps extending between an upper surface of the first chip and a lower surface of the second chip;

a homogeneous integral underfill material interposed between the first chip and the second chip, encapsulating the conductive bumps, and extending from an upper surface of the first chip, along sidewalls of the second chip to the upper surface of the second chip, wherein, with respect to a vertical cross sectional profile of the combination of the first chip, the second chip, and the homogeneous integral underfill material:

the homogeneous integral underfill material extends a first distance along the upper surface of the first chip, the first distance from a first location directly under a first sidewall of the second chip to a second location at an edge of the underfill material at the upper surface of the first chip that is not under the second chip, the homogeneous integral underfill material comprises an upper surface extending away from the first sidewall a second distance, and a ratio of the second distance to the first distance less than or equal to 0.5.

31. The stack of claim 30, wherein a ratio of the second distance to the first distance less than or equal to 0.3.

32. The stack of claim 30, wherein a ratio of the second distance to the first distance less than or equal to 0.1.

33. The semiconductor package of claim 30, wherein the second chip is directly mounted on the first chip.

34. The semiconductor package of claim 30, wherein the homogeneous integral underfill material contacts the upper surface of the first chip.

35. A stack of semiconductor chips comprising:

a first chip of the stack;

a second chip of the stack over the first chip;

conductive bumps extending between an upper surface of the first chip and a lower surface of the second chip;

a homogeneous integral underfill material interposed between the first chip and the second chip, encapsulating the conductive bumps, and extending along sidewalls of the second chip, the homogeneous integral underfill material having a an uppermost surface at sidewalls of the second chip located within 5 um of a first plane in which an upper surface of the second chip lies; and a molding material on outer side surfaces of the homogeneous integral underfill material above the upper surface of the first chip, the molding material being separated from sidewalls of the second chip by the homogeneous integral underfill material.

36. The stack of claim 35, wherein the entire upper surface of the molding material, the entire upper surface of the homogeneous integral underfill material and the entire upper surface of the second chip each lie within 5 um of the first plane.

37. The stack of claim 35, wherein the molding material does not contact sidewalls of the second chip.

38. The stack of claim 35, wherein the upper surface of the second chip is not covered by the homogeneous integral underfill material.

39. The stack of claim 35, wherein an upper surface of the first chip is planar and is parallel to the first plane.

40. The stack of claim 12, wherein an upper surface of the first chip is planar and is parallel to the first plane.

41. The stack of claim 28, wherein the entire upper surface of the homogeneous underfill material and the entire upper surface of the second chip lie within 5 um of a first plane.

42. The stack of claim 29, wherein the entire upper surface of the homogeneous underfill material and the entire upper surface of the second chip lie within 5 um of a first plane.

* * * * *